US012686276B2

(12) United States Patent
Maeda

(10) Patent No.: US 12,686,276 B2
(45) Date of Patent: Jul. 21, 2026

(54) DRIVE DEVICE AND DETERIORATION DISCRIMINATION METHOD

(71) Applicant: Mitsubishi Electric Corporation, Tokyo (JP)

(72) Inventor: Shinsaku Maeda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 215 days.

(21) Appl. No.: 18/727,009

(22) PCT Filed: Apr. 1, 2022

(86) PCT No.: PCT/JP2022/017014
§ 371 (c)(1),
(2) Date: Jul. 5, 2024

(87) PCT Pub. No.: WO2023/188439
PCT Pub. Date: Oct. 5, 2023

(65) Prior Publication Data
US 2025/0091444 A1 Mar. 20, 2025

(51) Int. Cl.
G01M 7/00 (2006.01)
B60L 3/00 (2019.01)
G01R 31/34 (2020.01)

(52) U.S. Cl.
CPC .......... B60L 3/0061 (2013.01); G01R 31/343 (2013.01); *B60L 2200/26* (2013.01)

(58) Field of Classification Search
CPC . B60L 3/0061; B60L 2200/26; G01R 31/343; G01R 31/008; G01M 7/00
(Continued)

(56) References Cited

U.S. PATENT DOCUMENTS

2009/0174349 A1* 7/2009 Iwashita ................... H02P 3/18
318/400.06
2013/0320905 A1* 12/2013 Uryu ...................... H02K 11/20
318/490
(Continued)

FOREIGN PATENT DOCUMENTS

JP 2020008347 A 1/2020

OTHER PUBLICATIONS

International Search Report (PCT/ISA/210) with translation and Written Opinion (PCT/ISA/237) mailed on Jun. 14, 2022, by the Japan Patent Office as the International Searching Authority for International Application No. PCT/JP2022/017014. (9 pages).

*Primary Examiner* — Gabriel Agared
(74) *Attorney, Agent, or Firm* — BUCHANAN, INGERSOLL & ROONEY PC

(57) ABSTRACT

A drive apparatus includes a power circuit and a deterioration determining device. The power circuit outputs, to a load, a current including a current component having a frequency determined by a natural frequency of at least one member of the load or a vibratory member to vibrate when receiving vibration resulting from an electromagnetic excitation force generated in the load or by a value of a natural number multiple of a rotation frequency of a rotator that is one of the at least one member. The deterioration determining device generates frequency domain data based on a sensor signal output by a vibration sensor and determines deterioration of the at least one member of the load or the vibratory member based on a value of a frequency spectrum indicated by the frequency domain data at the natural frequency or the rotation frequency used to determine the frequency of the current component.

20 Claims, 15 Drawing Sheets

(58) Field of Classification Search
USPC .......................................................... 318/490
See application file for complete search history.

(56) References Cited

U.S. PATENT DOCUMENTS

| | | | | |
|---|---|---|---|---|
| 2020/0180438 A1* | 6/2020 | Shin | .......................... | B60L 3/12 |
| 2021/0167715 A1* | 6/2021 | Tagawa | ................ | H02H 7/1216 |
| 2021/0181264 A1* | 6/2021 | Kratochvil | ............. | G01R 31/40 |
| 2022/0130179 A1* | 4/2022 | Kimura | .................. | G07C 5/085 |

* cited by examiner

FIG.2

DRIVE DEVICE AND DETERIORATION DISCRIMINATION METHOD

TECHNICAL FIELD

The present disclosure relates to a drive apparatus and a deterioration determining method.

BACKGROUND ART

Some loads that receive power from a power supply vibrate due to an electromagnetic excitation force. One example of such a load is an electric motor mounted on a railway vehicle to generate a driving force for the railway vehicle. When any member of the electric motor deteriorates, the electric motor vibrates by a greater degree with an electromagnetic excitation force and may affect the travel of the railway vehicle. For a reliable operation of the railway vehicle, any deterioration of the electric motor is determined. Patent Literature 1 describes an example method for determining any deterioration of an electric motor. The method described in Patent Literature 1 performs frequency analysis on the measurement value of the ground leakage current of the electric motor to determine the state of the electric motor as being normal or abnormal based on frequency domain data.

CITATION LIST

Patent Literature

Patent Literature 1: Unexamined Japanese Patent Application Publication No. 2020-008347

SUMMARY OF INVENTION

Technical Problem

Although the method described in Patent Literature 1 can determine any abnormality of the electric motor, the method cannot determine any deterioration in each member of the electric motor, such as a rotor, a stator, and a shaft. Additionally, the method described in Patent Literature 1 cannot determine any deterioration of a vibratory member that vibrates when receiving vibration resulting from an electromagnetic excitation force generated in the electric motor, for example, any deterioration of a bogie to which the electric motor is attached.

Under such circumstances, an objective of the present disclosure is to provide a drive apparatus and a deterioration determining method capable of determining any deterioration of the members of a load or the vibratory member.

Solution to Problem

To achieve the above objective, a drive apparatus according to an aspect of the present disclosure includes a power circuit and a deterioration determining device. The power circuit outputs, to a load, a current including a current component having a frequency determined by a natural frequency of at least one member of the load, a natural frequency of a vibratory member to vibrate when receiving vibration resulting from an electromagnetic excitation force generated in the load, or a value of a natural number multiple of a rotation frequency of a rotator that is rotatable, the rotator being one of the at least one member. The deterioration determining device generates frequency domain data indicating a magnitude of vibration of the load or the vibratory member for each frequency based on a sensor signal output by a vibration sensor to measure a magnitude of vibration of the load or the vibratory member, and determines any deterioration of the at least one member of the load or the vibratory member based on a value of a frequency spectrum indicated by the frequency domain data at the natural frequency or the rotation frequency used in determination of the frequency of the current component.

Advantageous Effects of Invention

The drive apparatus according to the above aspect of the present disclosure outputs, to the load, the current including the current component having the frequency determined by the natural frequency of the member of the load, the natural frequency of the vibratory member, or the value of the natural number multiple of the rotation frequency of the rotator that is one of the member of the load. The drive apparatus determines any deterioration of the member of the load or the vibratory member based on the frequency spectrum value at the natural frequency or the rotation frequency indicated by the frequency domain data indicating the magnitude of vibration of the load or the vibratory member for each frequency.

BRIEF DESCRIPTION OF DRAWINGS

FIG. 2 is a block diagram of the drive apparatus according to Embodiment 1;

DESCRIPTION OF EMBODIMENTS

Figure 1:
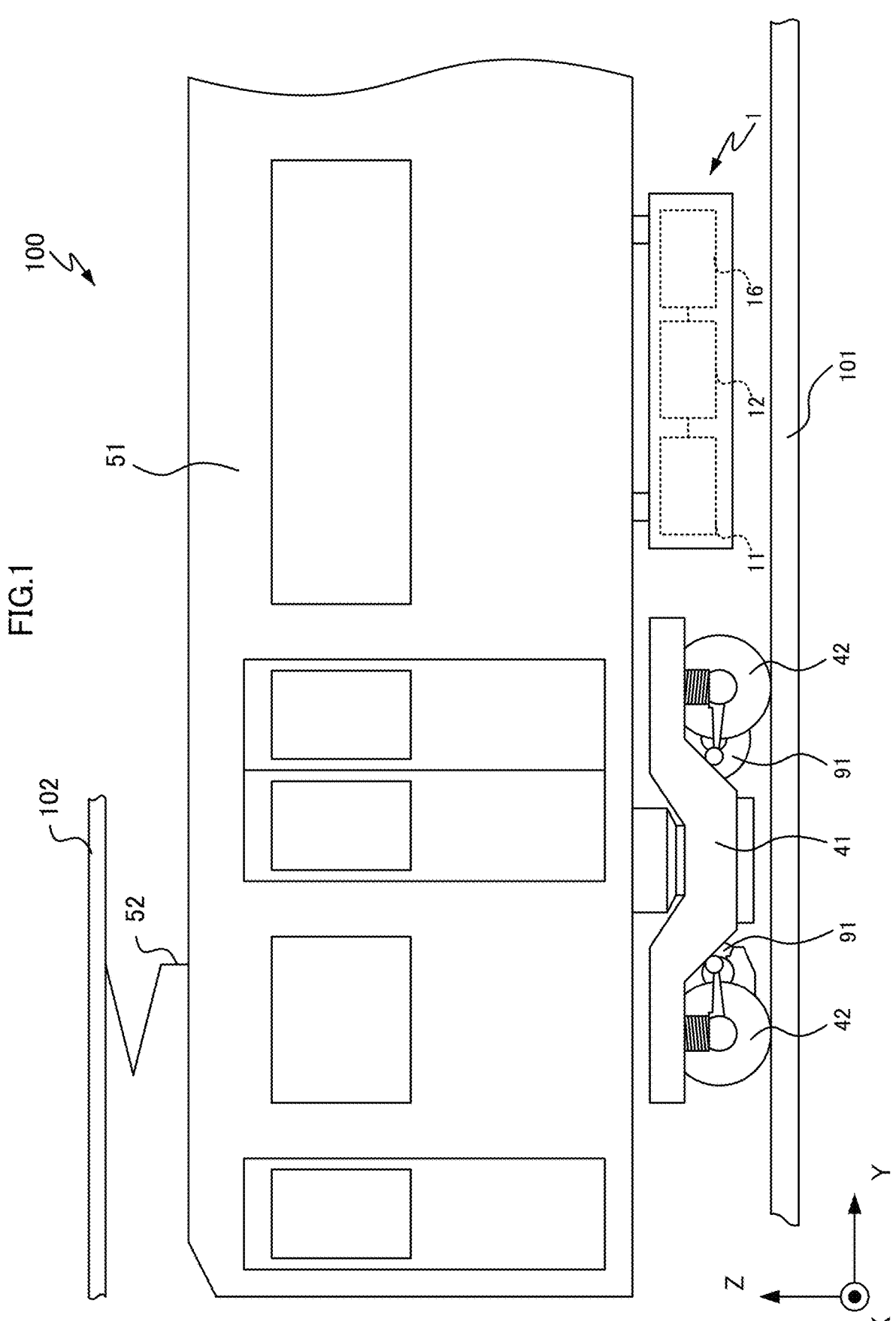
FIG. 1 is a diagram of an example drive apparatus mounted on a railway vehicle according to Embodiment 1.

A drive apparatus and a deterioration determining method according to embodiments of the present disclosure are described in detail with reference to the drawings. Components identical or corresponding to each other are provided with the same reference sign in the drawings

Embodiment 1

In the example described below, a drive apparatus 1 according to Embodiment 1 is a drive apparatus mounted on a railway vehicle to determine any deterioration of an electric motor that generates a driving force for the railway vehicle. A railway vehicle 100 illustrated in FIG. 1 includes one or more vehicles 51, bogies 41 movable on rails 101 and supporting the vehicles 51, and a current collector 52 that acquires power supplied from a non-illustrated electrical substation through a power line 102.

In FIG. 1, the X-axis direction indicates the width direction of the vehicle 51. The Y-axis direction indicates the traveling direction of the railway vehicle 100. The Z-axis is perpendicular to the X- and Y-axes. The Z-axis direction indicates a vertical direction for the railway vehicle 100 located horizontally.

At least one of the vehicles 51 is a motor coach. FIG. 1 illustrates a vehicle 51 that is a motor coach. Each vehicle 51 has two bogies 41. In FIG. 1, one bogie 41 alone is illustrated. The current collector 52 is, for example, a pantograph that acquires power through an overhead line that is the power line 102 or is a current collector shoe that acquires power through a third rail that is the power line 102.

Figure 2:
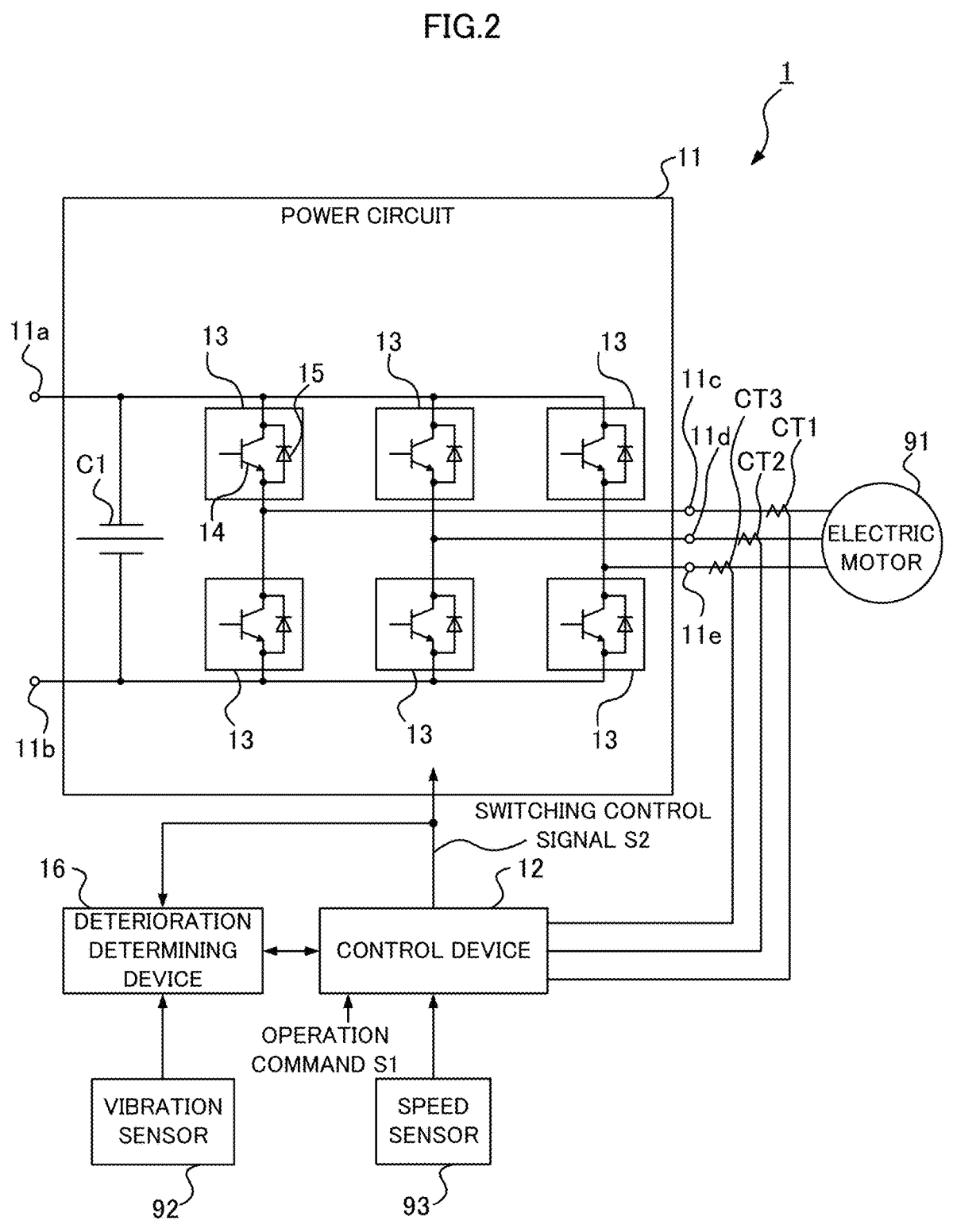

A housing installed under the floor of the vehicle 51 accommodates, for example, a power circuit 11, a control device 12, and a deterioration determining device 16 included in the drive apparatus 1 illustrated in FIG. 2. The railway vehicle 100 illustrated in FIG. 1 further includes one or more electric motors 91 driven by power from the power circuit 11 that converts and outputs the input power from the current collector 52. In Embodiment 1, two electric motors 91 are attached to each of the two bogies 41 installed in each vehicle 51. In other words, each vehicle 51 has four electric motors 91. The four electric motors 91 in a single vehicle 51 are driven by power from the same power circuit 11.

In Embodiment 1, the railway vehicle 100 uses a direct current (DC) feeder. In this case, the power circuit 11 converts the DC power acquired by the current collector 52 to three-phase alternating current (AC) power and supplies the three-phase AC power to the electric motors 91. In Embodiment 1, each motor 91 includes a three-phase induction motor and is driven by three-phase AC power supplied from the power circuit 11.

Although the structure of each electric motor 91 is not illustrated in detail, each electric motor 91 includes a shaft supported in a rotatable manner, a rotor including a rotor core and rotor conductors placed in slots in the outer circumferential surface of the rotor core, and a stator including a stator core and stator coils placed in slots in the inner circumferential surface of the stator core. Each electric motor 91 further includes an insulator that insulates the rotor core from the rotor conductors, an insulator that insulates the stator core from the stator coils, and an insulator that insulates adjacent stator coils from each other.

Figure 3:
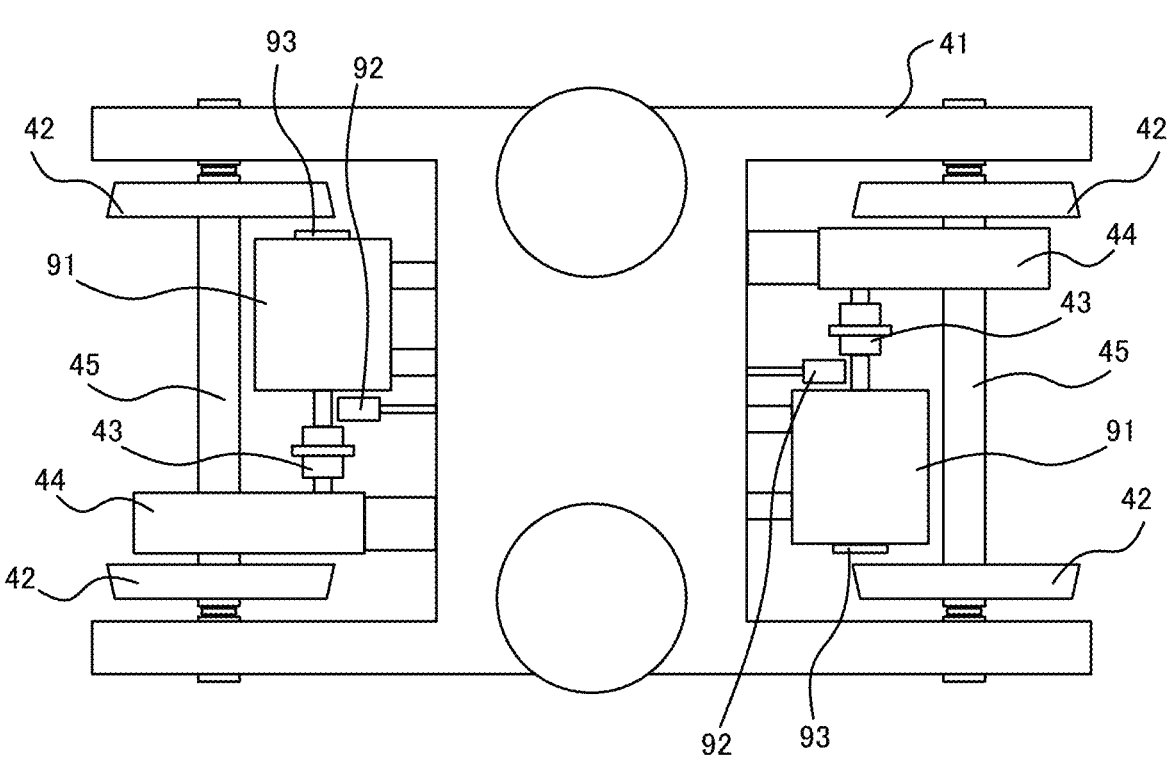
FIG. 3 is a diagram of vibration sensors attached at example positions in Embodiment 1.
Figure 3:
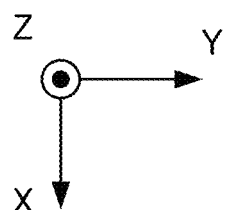

As in FIG. 3 that illustrates the bogie 41 as viewed from above in the vertical direction, the bogie 41 includes couplings 43 connected to the respective shafts of the electric motors 91, gear devices 44 that transmit a rotational force transmitted from the respective electric motors 91 through the respective couplings 43 to axles 45, the axles 45, and wheels 42 attached to both ends of each axle 45. When each electric motor 91 is driven by power from the power circuit

11, the shaft of each electric motor 91 rotates, and the rotational force of the shaft is transmitted to the axle 45 through the coupling 43 and the gear device 44. As the axle 45 rotates, the wheels 42 attached to both ends of the axle 45 rotate to generate a driving force for the railway vehicle 100.

Similarly, in the other bogie 41 not illustrated in FIG. 1, when each electric motor 91 is driven by power from the power circuit 11, the shaft of each electric motor 91 rotates, and the rotational force of the shaft is transmitted to the axle 45 through the coupling 43 and the gear device 44. As the axle 45 rotates, the wheels 42 attached to both ends of the axle 45 rotate to generate a driving force for the railway vehicle 100.

As illustrated in FIG. 3, each electric motor 91 is attached to the bogie 41. The bogie 41 thus receives vibration resulting from the electromagnetic excitation force generated in each electric motor 91 when energized. When receiving vibration transmitted from each electric motor 91, the bogie 41 vibrates. In other words, the bogie 41 is a vibratory member that vibrates when receiving vibration transmitted from the electric motors 91. Similarly, the couplings 43, the gear devices 44, the axles 45, and the wheels 42 are also vibratory members that vibrate when receiving vibration transmitted from the electric motors 91.

As described below, the drive apparatus 1 determines any deterioration of the members of the electric motors 91 or the vibratory members that vibrate when receiving vibration transmitted from the electric motors 91. As described above, the members of each electric motor 91 include, for example, the shaft, the rotor, the stator, and the insulators. The drive apparatus 1 illustrated in FIG. 2 includes the power circuit 11 that converts DC power supplied from the current collector 52 to three-phase AC power and supplies the three-phase AC power to a load, and the control device 12 that controls the power circuit 11 in response to an operation command S1.

The drive apparatus 1 further includes the deterioration determining device 16 that determines any deterioration of the members of the electric motors 91 or the vibratory members that vibrate when receiving vibration resulting from the electromagnetic excitation force generated in the electric motor 91. The electric motors 91 are each an example of a load that receives AC power from the power circuit 11. For simplicity, FIG. 2 illustrates a single electric motor 91 alone, but any number of electric motors 91 can receive power from the power circuit 11. In Embodiment 1, as described above, the four electric motors 91 in a single vehicle 51 receive power from the same power circuit 11.

When receiving power from the power circuit 11, each electric motor 91 vibrates under the electromagnetic excitation force. The vibratory members vibrate when receiving vibration resulting from the electromagnetic excitation force from the electric motor 91. The frequency of the electromagnetic excitation force depends on the frequency of the output current of the power circuit 11. The members of the electric motor 91 and the vibratory members include members having the natural frequency matching the frequency of the electromagnetic excitation force. Such members resonate and vibrate by a greater degree. The natural frequency matching the frequency of the electromagnetic excitation force refers to the natural frequency falling within a sufficiently narrow frequency range including the frequency of the electromagnetic excitation force. The sufficiently narrow frequency range is, for example, a frequency range including errors within 5% from the frequency of the electromagnetic excitation force.

The members of the electric motor 91 include rotatable rotators, such as the shaft and the rotor, that resonate and vibrate by a greater degree when the rotation frequency matches the frequency of the electromagnetic excitation force or the frequency divided by the frequency of the electromagnetic excitation force. In other words, when the value of a natural number multiple of the rotation frequency of the rotators matches the frequency of the electromagnetic excitation force, the rotators resonate and vibrate by a greater degree. The value of the natural number multiple of the rotation frequency matching the frequency of the electromagnetic excitation force refers to the value of the natural number multiple of the rotation frequency falling within a sufficiently narrow frequency range including the frequency of the electromagnetic excitation force.

Thus, when the power circuit 11 controlled by the control device 12 outputs a current including a current component having a frequency determined by the natural frequency of the members of the electric motor 91 and the natural frequency of the vibratory members, the members of the electric motor 91 or the vibratory members having the natural frequency matching the frequency of the current component resonate included in the output of the power circuit 11. The natural frequency matching the frequency of the current component included in the output of the power circuit 11 refers to the natural frequency falling within a sufficiently narrow frequency range including the frequency of the current component included in the output of the power circuit 11.

Similarly, when the power circuit 11 outputs a current including a current component having a frequency determined by the value of the natural number multiple of the rotation frequency of the rotatable rotators that are ones of the members of the electric motor 91, the rotators resonate.

The members of the electric motor 91 or the vibratory members resonate by a greater degree when the members deteriorate than when the members are not deteriorating. The power circuit 11 outputs a current including a current component having a frequency determined by the natural frequency of the members of the electric motor 91, the natural frequency of the vibratory members, or the value of the natural number multiple of the rotation frequency of the rotators. While the current including the above current components is being output, the deterioration determining device 16 determines any deterioration of the members of the electric motor 91 or the vibratory members based on sensor signals acquired from vibration sensors 92 that measure the vibration magnitude of the members of the electric motors 91 or the vibratory members. The sensor signals output by the vibration sensors 92 are analog data signals with the amplitude varying with the vibration magnitude to be measured.

In Embodiment 1, the deterioration determining device 16 determines any deterioration of the shaft of the electric motor 91 based on a sensor signal output by a vibration sensor 92 that measures the vibration magnitude of the shaft of the electric motor 91. The structure in Embodiment 1 has as many vibration sensors 92 as the electric motors 91. More specifically, each vehicle 51 includes four vibration sensors 92. For simplicity, FIG. 2 illustrates a single vibration sensor 92 alone. Each vibration sensor 92 includes, for example, a contactless sensor, and is separate from but adjacent to the shaft of the corresponding electric motor 91, as illustrated in FIG. 3.

The drive apparatus 1 is described in detail below.

The power circuit 11 illustrated in FIG. 2 includes an input terminal 11a connected to the current collector 52 through a contactor or a reactor, which is not illustrated, an input terminal 11b that is grounded, and output terminals 11c, 11d, and 11e connected to the electric motor 91. The power circuit 11 further includes a capacitor C1 connected to the input terminals 11a and 11b, and three pairs of two switching elements 13 connected in series. The three pairs of two switching elements 13 correspond to the U phase, the V phase, and the W phase of three-phase AC power. The two switching elements 13 corresponding to the U phase, the two switching elements 13 corresponding to the V phase, and the two switching elements 13 corresponding to the W phase are connected in parallel, to each other, between the input terminals 11a and 11b.

The connection point of the two switching elements 13 corresponding to the U phase is electrically connected to the output terminal 11c. The connection point of the two switching elements 13 corresponding to the V phase is electrically connected to the output terminal 11d. The connection point of the two switching elements 13 corresponding to the W phase is electrically connected to the output terminal 11e.

In Embodiment 1, each switching element 13 includes an insulated-gate bipolar transistor (IGBT) 14 and a freewheeling diode 15 having the anode connected to the emitter terminal of the IGBT 14 and the cathode connected to the collector terminal of the IGBT 14. The control device 12 provides a switching control signal S2 to the gate terminal of the IGBT 14 included in each switching element 13. The switching control signal S2 switches each switching element 13 between on and off. Each switching element 13 performs the switching operation between on and off to cause the power circuit 11 to convert DC power to three-phase AC power. Preferably, each switching element 13 is formed of a wide bandgap semiconductor such as silicon carbide, a gallium nitride-based material, or diamond.

The capacitor C1 is charged with DC power supplied from the current collector 52. The capacitor C1 reduces harmonic components contained in the DC power supplied from the current collector 52.

The control device 12 acquires a measured rotational speed of the electric motor 91 per unit time from a speed sensor 93 that detects the rotational speed of the electric motor 91. The speed sensor 93 is attached to, for example, a non-drive end portion of the shaft of each electric motor 91, as illustrated in FIG. 3. The electric motor 91 includes a pulse generator (PG) that outputs a sensor signal with a value that changes with rotation of the shaft. The speed sensor 93 detects the rotational speed of the electric motor 91 per unit time from the sensor signal output by the PG, and outputs the detected rotational speed. The structure in Embodiment 1 has as many speed sensors 93 as the electric motors 91. For simplicity, FIG. 2 illustrates a single speed sensor 93 alone.

The control device 12 acquires the measured U-, V-, and W-phase currents from current sensors CT1, CT2, and CT3 that measure the respective U-, V-, and W-phase currents output by the power circuit 11. The current sensors CT1, CT2, and CT3 each include a current transformer (CT) installed in the electrical circuit between the output terminals 11c, 11d, and 11e of the power circuit 11 and the electric motor 91.

The control device 12 acquires the operation command S1 from a non-illustrated driver's cab. The operation command S1 indicates a command corresponding to an operation performed by an operator on a master control device installed in the driver's cab. More specifically, the operation command S1 indicates any one of a powering command, a braking command, or a coasting command. The coasting command indicates a state in which neither the powering command nor the braking command is provided.

The control device 12 generates a voltage command indicating a target value of the output voltage of the power circuit 11 based on the measured rotational speed of the electric motor 91, the measured U-, V-, and W-phase currents, and the operation command S1 acquired as described above. The control device 12 generates multiple switching control signals S2 determined based on a voltage specification and a carrier wave signal, and transmits the multiple switching control signals S2 to the multiple switching elements 13. Thus, the output voltage of the power circuit 11 approaches the target value.

When the output power of the power circuit 11 is small, more specifically, when the speed of the railway vehicle 100 is in a low speed range, the control device 12 controls the power circuit 11 to output a rated current superimposed with a current component having a frequency determined by the value of the natural frequency of the members of the electric motor 91, the value of the natural frequency of the vibratory members, or the value of the natural number multiple of the rotation frequency of the rotators that are ones of the members of the electric motor 91, and causes the members of the electric motor 91 or the vibratory members to resonate. The frequency determined by the value of the natural frequency of the members of the electric motor 91, the value of the natural frequency of the vibratory members, or the value of the natural number multiple of the rotation frequency of the rotators is included in the frequency range in which the members of the electric motor 91 or the vibratory members resonate.

The control device 12 prestores information about the natural frequency of the members of the electric motor 91 or the vibratory members to be a deterioration determination target of the deterioration determining device 16. The natural frequency is determined by the mass and rigidity of the members. The control device 12 may thus prestore information about the natural frequency acquired from the design information about the members of the electric motor 91 or the vibratory members. When the deterioration determination target of the deterioration determining device 16 is a rotator, the control device 12 may determine the rotation frequency of the electric motor 91 based on the measurement value acquired from the speed sensor 93 and use the rotation frequency as the rotation frequency of the rotator.

The low speed range of the railway vehicle 100 indicates, for example, a range in which the speed of the railway vehicle 100 is less than or equal to 30 km/h. When the speed of the railway vehicle 100 is in the low speed range, the output power of the power circuit 11 is lower than when the speed of railway vehicle 100 is in a high speed range, and the impact on the operation of the electric motor 91 is minimal even if the current component described above is superimposed on the output current of the power circuit 11.

To suppress the likelihood that the current component described above superimposed on the rated current affects the operation of the electric motor 91, the control device 12 preferably controls the power circuit 11 to output the rated current when the speed of the railway vehicle 100 is higher than speeds in the low speed range. The rated current is AC that drives the electric motor 91 and has an amplitude within an amplitude range for driving the electric motor 91.

In Embodiment 1, the power circuit 11 outputs a current in which a current component having a frequency determined by the natural frequency of the shaft of the electric motor 91, more specifically, a current component having a frequency matching the natural frequency of the shaft of the electric motor 91, is superimposed on a rated current. The frequency matching the natural frequency is a frequency that falls within a sufficiently narrow frequency range that can be regarded as the same as the natural frequency. The sufficiently narrow frequency range is, for example, a frequency range including errors within 5% from the natural frequency.

Figure 4:
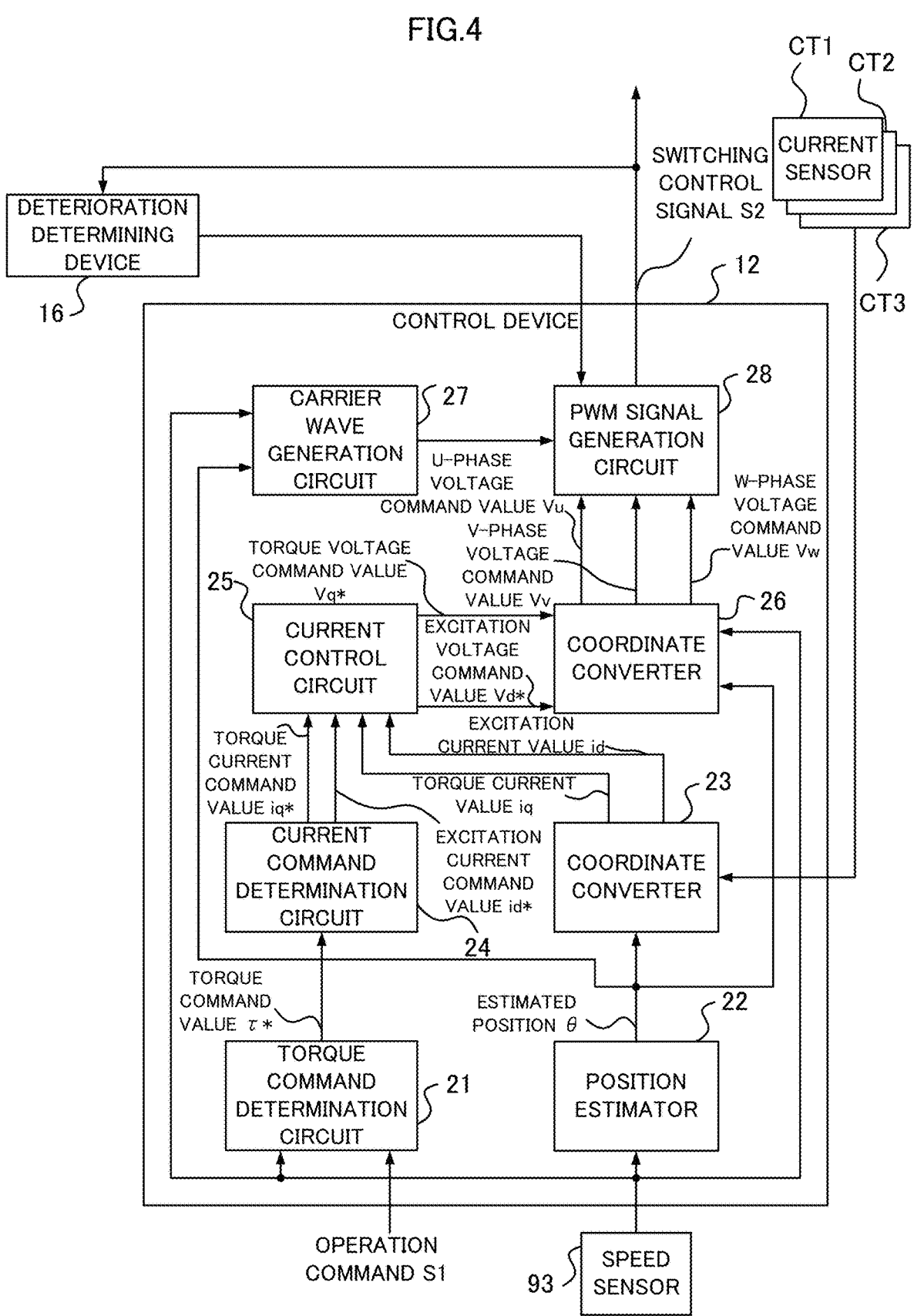
FIG. 4 is a block diagram of a control device in Embodiment 1.

The control device 12 is described in detail with reference to FIG. 4. The control device 12 includes a torque command determination circuit 21 that determines, based on an operation command S1 and a measured rotational speed of each electric motor 91 acquired from the corresponding speed sensor 93, a torque command value τ* that is a target value of the torque for the electric motor 91, and a position estimator 22 that estimates the position of the rotor in each electric motor 91 by integration of the measured rotational speed of the electric motor 91 and outputs an estimated position θ. The electric motors 91 are installed in the same vehicle 51 and operate in the same manner. The torque command determination circuit 21 thus determines the torque command value τ* from, for example, the average of the measured rotational speeds of the electric motors 91. Similarly, the position estimator 22 integrates the average of the measured rotational speeds of the electric motors 91 to estimate the position of the rotor.

The control device 12 further includes a coordinate converter 23 that converts the U-, V-, and W-phase currents acquired from the current sensors CT1, CT2, and CT3 from three-phase coordinates to dq rotation coordinates based on the estimated position θ and determines and outputs the excitation current value id and the torque current value iq, and a current command determination circuit 24 that determines and outputs an excitation current value id* and a torque current command value iq* based on the torque command value τ*.

The control device 12 further includes a current control circuit 25 that determines an excitation voltage command value Vd* based on the difference between the excitation current value id and the excitation current command value id*, determines a torque voltage command value Vq* based on the difference between the torque current value iq and the torque current command value iq*, and outputs the excitation voltage command value Vd* and the torque voltage command value Vq*.

The control device 12 further includes a coordinate converter 26 that converts the excitation voltage command value Vd* and the torque voltage command value Vq* from dq rotation coordinates to three-phase coordinates based on the estimated position θ to determine a U-phase voltage command value Vu, a V-phase voltage command value Vv, and a W-phase voltage command value Vw. The U-phase voltage command value Vu, the V-phase voltage command value Vv, and the W-phase voltage command value Vw are the respective target values of the U-, V-, and W-phase voltages output by the power circuit 11. The U-phase voltage command value Vu, the V-phase voltage command value Vv, and the W-phase voltage command value Vw output by the coordinate converter 26 are expressed by sine waves. More specifically, the coordinate converter 26 outputs a U-phase voltage command that is a sine wave indicating the U-phase voltage command value Vu, a V-phase voltage command that is a sine wave indicating the V-phase voltage command value Vv, and a W-phase voltage command that is a sine wave indicating the W-phase voltage command value.

When the speed of the railway vehicle 100 is in the low speed range, the coordinate converter 26 outputs the U-, V-, and W-phase voltage commands having a frequency matching the natural frequency of the shaft of the electric motor 91 to cause the output current of the power circuit 11 to include a current component having a frequency matching the natural frequency of the shaft of the electric motor 91 as described above. More specifically, when the measured rotational speed of the electric motor 91 is in the rotational speed range corresponding to the low speed range of the railway vehicle 100, the coordinate converter 26 outputs the U-, V-, and W-phase voltage commands having a frequency matching the natural frequency of the shaft of the electric motor 91.

When the speed of the railway vehicle 100 is higher than speeds in the low speed range, the coordinate converter 26 outputs the U-, V-, and W-phase voltage commands expressed in sine waves with a frequency corresponding to the rotational speed of the electric motor 91 to cause the power circuit 11 to output the rated current as described above. More specifically, when the measured rotational speed of the electric motor 91 is out of the rotational speed range corresponding to the low speed range of the railway vehicle 100, the coordinate converter 26 outputs the U-, V-, and W-phase voltage commands having a frequency that is set based on the rotational speed of the electric motor 91.

The control device 12 further includes a carrier wave generation circuit 27 that generates and outputs a carrier wave signal that is a triangular wave. When the speed of the railway vehicle 100 is in the low speed range, the carrier wave generation circuit 27 operates in an asynchronous mode in which the frequency of the triangular wave is set to a frequency defined independently of the rotational speed of the electric motor 91 and sufficiently higher than the rotation frequency of the electric motor 91. When the speed of the railway vehicle 100 is higher than speeds in the low speed range, the carrier wave generation circuit 27 operates in a synchronous mode in which the frequency of the triangular wave is set based on the rotational speed of the electric motor 91. More specifically, in the synchronous mode, the frequency of the triangular wave is set to the value of a natural number multiple of the frequency of the U-, V-, and W-phase voltage commands having a frequency that is set based on the rotational speed of the electric motor 91.

The control device 12 further includes a pulse-width modulation (PWM) signal generation circuit 28 that compares the target values indicated by the respective U-, V-, and W-phase voltage commands, more specifically, the U-phase voltage command value Vu, the V-phase voltage command value Vv, and the W-phase voltage command value Vw with the value of the carrier wave signal that is a triangular wave, and generates multiple switching control signals S2 that are PWM signals.

Figure 5:
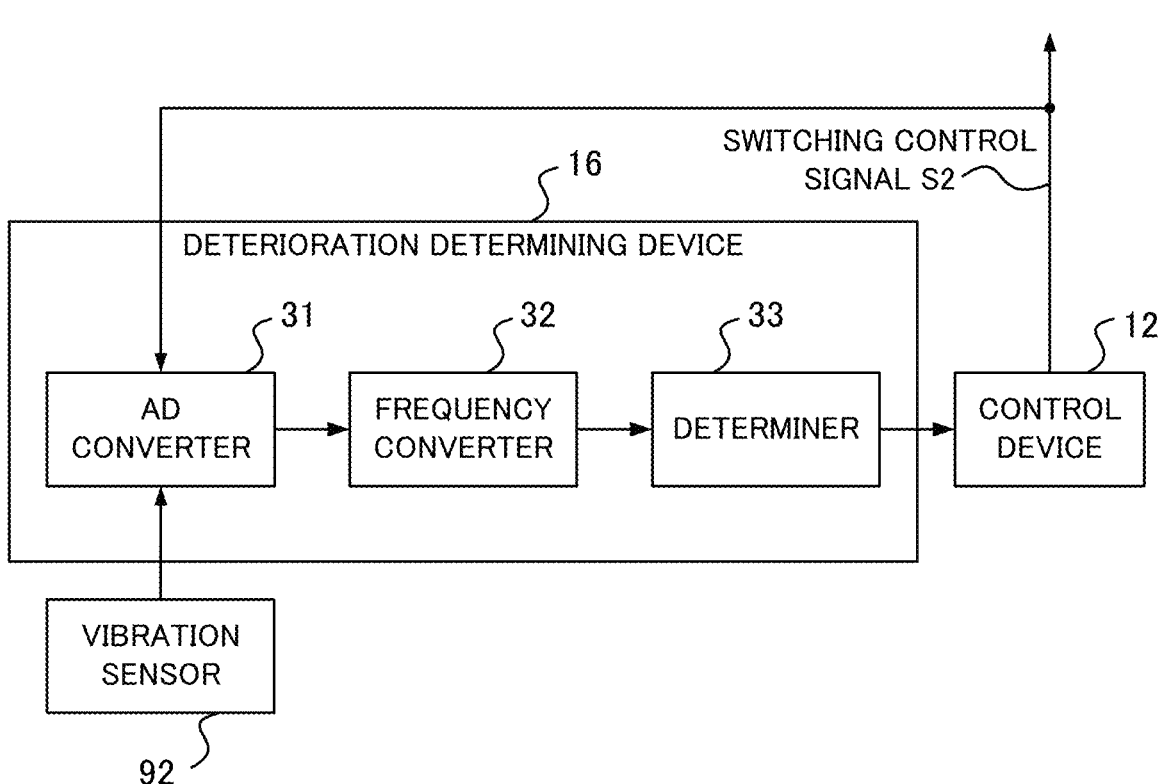
FIG. 5 is a block diagram of a deterioration determining device in Embodiment 1.

As illustrated in FIG. 5, the deterioration determining device 16 includes an analog-to-digital (AD) converter 31 that samples sensor signals output by vibration sensors 92 that measure the vibration magnitude of the members of the electric motor 91 or the vibratory members, for example, the shaft of the electric motor 91, at predetermined sampling intervals to generate digital data, and a frequency converter 32 that generates frequency domain data by performing frequency conversion, for example, a fast Fourier transform (FFT). The frequency domain data indicates the vibration magnitude of the members of the electric motor 91 or the vibratory members for each frequency.

The deterioration determining device 16 further includes a determiner 33 that determines any deterioration of the members of the electric motor 91 or the vibratory members based on the frequency spectrum value indicated by the frequency domain data at the natural frequency of the members of the electric motor 91 or the vibratory members or at the rotation frequency of the rotators used to determine the frequency of the current superimposed on the rated current. The determiner 33 may prestore information about the natural frequency of the members of the electric motor 91 or the vibratory members to be a deterioration determination target. The determiner 33 may acquire the measured rotational speed of the electric motor 91 per unit time from the speed sensor 93, and determine the rotation frequency based on the acquired measured rotational speed.

More specifically, the determiner 33 compares the frequency spectrum value at the natural frequency of a member of the electric motor 91 with the value of a threshold spectrum corresponding to the member of the electric motor 91. When the frequency spectrum value at the natural frequency of the member of the electric motor 91 indicated by the frequency domain data is greater than or equal to the value of the threshold spectrum, the member of the electric motor 91 can be determined as having deterioration.

The determiner 33 further compares the frequency spectrum value at the natural frequency of the vibratory member with the value of the threshold spectrum corresponding to the vibratory member. When the frequency spectrum value at the natural frequency of the vibratory member indicated by the frequency domain data is greater than or equal to the value of the threshold spectrum, the vibratory member can be determined as having deterioration.

The determiner 33 further compares the frequency spectrum value at the rotation frequency of the rotator with the value of the threshold spectrum corresponding to the rotator. When the frequency spectrum value at the rotation frequency of the rotator indicated by the frequency domain data is greater than or equal to the value of the threshold spectrum, the rotator that is one of the members of the electric motor 91 can be determined as having deterioration.

Figure 6:
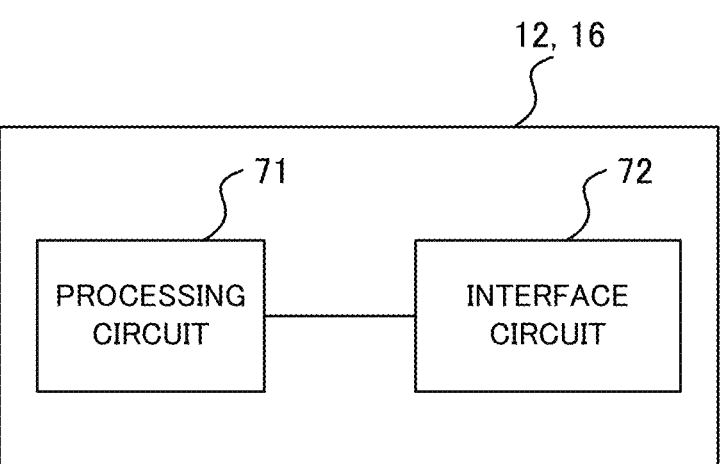
FIG. 6 is a block diagram of the control device and the deterioration determining device in Embodiment 1, illustrating the hardware configuration.

As illustrated in FIG. 6, the control device 12 and the deterioration determining device 16 with the above structure are implemented by a processing circuit 71. The processing circuit 71 is connected to, for example, the vibration sensor 92, the speed sensor 93, and the current sensors CT1, CT2, and CT3 through an interface circuit 72. When the processing circuit 71 is dedicated hardware, the processing circuit 71 includes, for example, a single circuit, a complex circuit, a processor, an application-specific integrated circuit (ASIC), a field-programmable gate array (FPGA), or a combination of two or more of these. Each part of the control device 12 may be implemented by an individual processing circuit 71 or by a common processing circuit 71. Similarly, each part of the deterioration determining device 16 may be implemented by an individual processing circuit 71 or by a common processing circuit 71.

Figure 7:
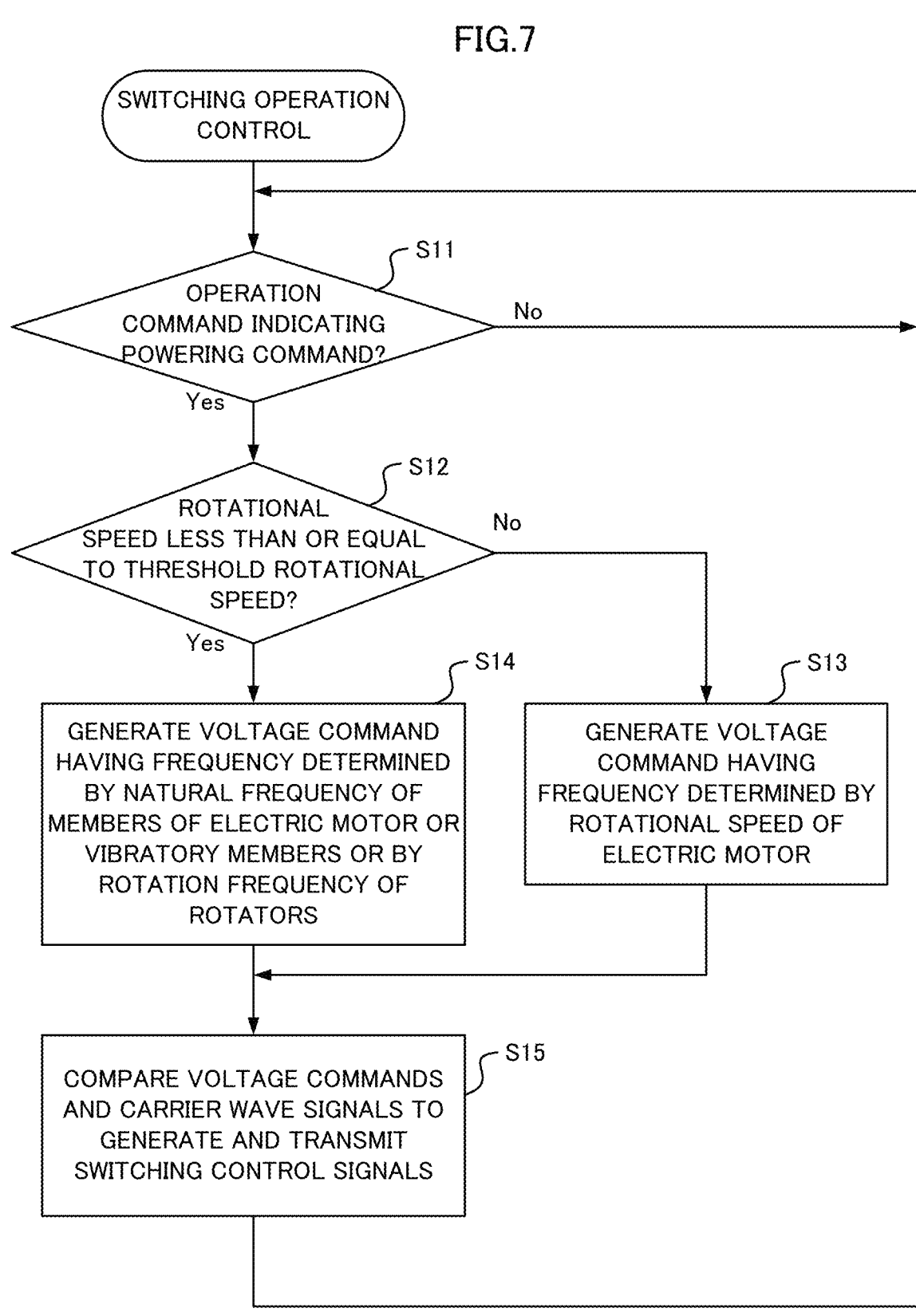
FIG. 7 is a flowchart of an example of process of switching operation control performed by the control device in Embodiment 1.

The process of controlling the switching operation of each switching element 13 performed by the control device 12 with the above structure is described with reference to FIG. 7. When the control device 12 acquires the operation command S1 from the driver's cab, the control device 12 starts the operation illustrated in FIG. 7. When the operation command does not indicate a powering command (No in step S11), the processing in step S11 is repeated.

When the operation command indicates the powering command (Yes in step S11) and the measured rotational speed of the electric motor 91 is higher than the threshold rotational speed that is the upper limit of the rotational speed range corresponding to the low speed range of the railway vehicle 100 (No in step S12), the control device 12 generates a voltage command having a frequency determined by the rotational speed of the electric motor 91, more specifically, U-, V-, and W-phase voltage commands (step S13). More specifically, when the measured rotational speed of the electric motor 91 acquired from the speed sensor 93 is higher than the threshold rotational speed, the coordinate converter 26 outputs a voltage command having a frequency determined by the rotational speed of the electric motor 91.

When the measured rotational speed of the electric motor 91 is lower than or equal to the threshold rotational speed (Yes in step S12), the coordinate converter 26 generates a voltage command having a frequency determined by the natural frequency of the members of the electric motor 91 or the vibratory members or by the rotation frequency of the rotators (step S14). For example, the coordinate converter 26 generates a voltage command having a frequency matching the natural frequency of the shaft of the electric motor 91.

After the processing in steps S13 and S14, the PWM signal generation circuit 28 compares the U-phase voltage command value Vu, the V-phase voltage command value Vv, and the W-phase voltage command value Vw respectively indicated by the U-, V-, and W-phase voltage commands with the values indicated by the carrier wave signals to generate the multiple switching control signals S2 and transmits the switching control signals S2 to the multiple switching elements 13 (step S15). The above processing is then performed repeatedly from step S11.

As described above, the control device 12 controls the output voltage of the power circuit 11 to be closer to the target value indicated by the voltage command generated in step S13 or step S14. Thus, the frequency of the output voltage and the output current of the power circuit 11 substantially matches the frequency of the voltage command generated in step S13 or step S14. In other words, when the measured rotational speed of the electric motor 91 is less than or equal to the threshold rotational speed, the frequency of the output current of the power circuit 11 is determined by the natural frequency of the members of the electric motor 91 or the vibratory members or by the rotation frequency of the rotator.

Figure 8:
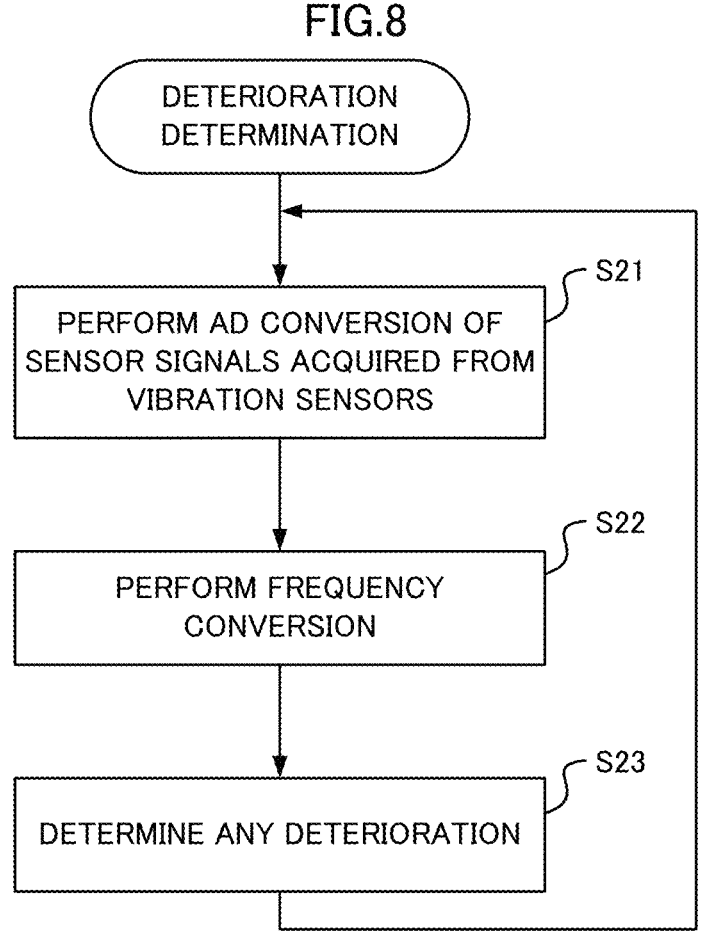
FIG. 8 is a flowchart of an example of process of deterioration determination performed by the deterioration determining device in Embodiment 1.

The operation of determining any deterioration of the members of the electric motor 91 or the vibratory members performed by the deterioration determining device 16 is described below. Any deterioration of the members of the electric motor 91 or the vibratory members is determined using resonance of the members of the electric motor 91 or the vibratory members having the natural frequency matching the frequency of the current component included in the output of the power circuit 11 or resonance of the rotators with the value of the natural number multiple of the rotation frequency matching the frequency of the current component included in the output of the power circuit 11. The deterioration determining device 16 acquires the multiple switching control signals S2 from the control device 12 and starts the process illustrated in FIG. 8 when the multiple switching control signals S2 indicate that any one of the switching elements 13 is turned on.

The AD converter 31 samples sensor signals output by the vibration sensors 92 at predetermined sampling intervals and performs AD conversion (step S21). More specifically, the AD converter 31 samples the sensor signals output by the vibration sensor 92 at predetermined sampling intervals, and generates digital data indicating the vibration magnitude measured by each vibration sensor 92.

The frequency converter 32 performs frequency conversion of the digital data generated in step S21, more specifically, data conversion from the time domain to the frequency domain to generate frequency domain data (step S22). More specifically, the frequency converter 32 generates the frequency domain data based on the measurement value of each vibration sensor 92.

The determiner 33 determines any deterioration of the members of the electric motor 91 or the vibratory members based on the frequency spectrum value indicated by the frequency domain data generated in step S22 at the natural frequency of the members of the electric motor 91 or the vibratory members or at the rotation frequency of the rotators used to determine the frequency of the current superimposed on the rated current and based on the value of the threshold spectrum corresponding to each member of the electric motor 91 and the vibratory member (step S23). The members of the electric motor 91 having the defined threshold spectrum include nonrotatable members and rotators. In Embodiment 1, the determiner 33 compares the frequency spectrum value at the natural frequency of the shaft of the electric motor 91 indicated by the frequency domain data with the value of the threshold spectrum corresponding to the shaft of the electric motor 91. When the frequency spectrum value at the natural frequency of the shaft of the electric motor 91 indicated by the frequency domain data is greater than or equal to the value of the threshold spectrum, the shaft of the electric motor 91 can be determined as having deterioration.

The determiner 33 transmits the determination result in step S23 to the control device 12. The above processing is then performed repeatedly from step S21. When the control device 12 receives, from the determiner 33, a determination result indicating that the members of the electric motor 91 have deteriorated, the control device 12 stops the power circuit 11.

As described above, when the speed of the railway vehicle 100 is in the low speed range, the drive apparatus 1 according to Embodiment 1 outputs, from the power circuit 11, a current including a current component having a frequency determined by the natural frequency of the members of the electric motor 91 or the vibratory members or by the rotation frequency of the rotatable rotators that are ones of the members of the electric motor 91. The drive apparatus 1 determines, with the deterioration determining device 16, any deterioration of the members of the electric motor 91 or the vibratory members using the frequency spectrum indicated by the frequency domain data based on the measurement value of the vibration sensor 92. An increase in the frequency of the output current of the power circuit 11 causes a decrease in the amplitude of vibration resulting from the electromagnetic excitation force. This allows determination of any deterioration of the members of the electric motor 91 with less likelihood of the electric motor 91 being affected by vibration.

Although the measurement value of the vibration sensor 92 includes the magnitude of vibration resulting from the travel of the railway vehicle 100, the vibration resulting from the travel of the railway vehicle 100 does not have a peak value at the natural frequency of the members of the electric motor 91 or the vibratory members in the frequency domain. Thus, the drive apparatus 1 can determine any deterioration based on the frequency spectrum value at the natural frequency of the members of the electric motor 91 or the vibratory members or at the rotation frequency of the rotators as described above, with less likelihood of the traveling railway vehicle 100 being affected by vibration.

Embodiment 2

Figure 9:
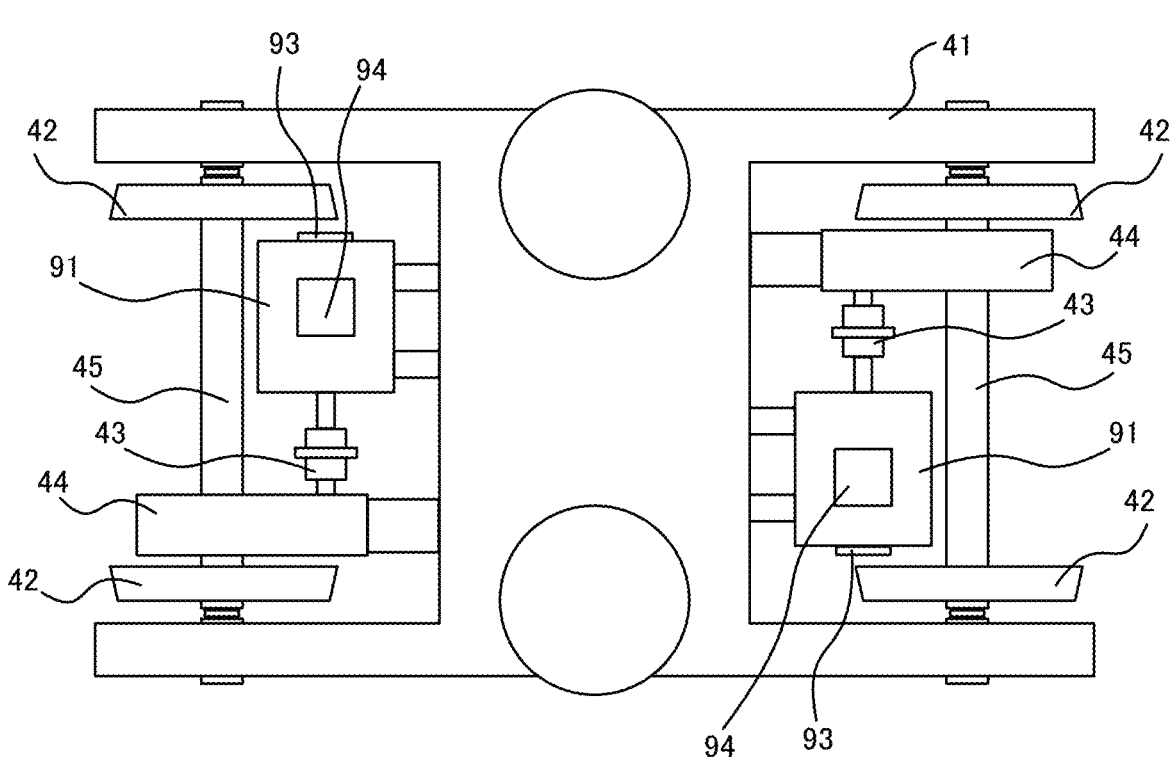
FIG. 9 is a diagram of vibration sensors attached at example positions in Embodiment 2.
Figure 9:
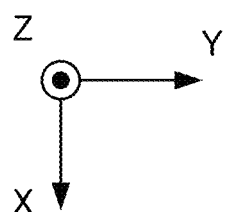

In Embodiment 1, any deterioration of the shaft of the electric motor 91 is determined, but the drive apparatus 1 may determine any deterioration of each of the multiple members of the electric motor 91. The structure of a drive apparatus 1 according to Embodiment 2 is the same as the structure of the drive apparatus 1 according to Embodiment 1 illustrated in FIG. 2. In Embodiment 2, as illustrated in FIG. 9, vibration sensors 94 are each attached to the outer surface of a vertical upper portion of the corresponding electric motor 91. In this case, the measurement values of each vibration sensor 94 include vibration of the multiple members of each electric motor 91, such as a stator, a frame to which the stator is attached, a rotor, a shaft, and a bearing supporting the shaft in a rotatable manner.

The structure of the power circuit 11 and the control device 12 is the same as in Embodiment 1, but differs from the structure in Embodiment 1 in that the control device 12 performs control to change the frequency of the current component included in the current output by the power circuit 11 for each determination period. The determination period is a period for determining any deterioration of the members of the electric motor 91 or the vibratory members with the deterioration determining device 16, and is, for example, 10 seconds or less.

Figure 10:
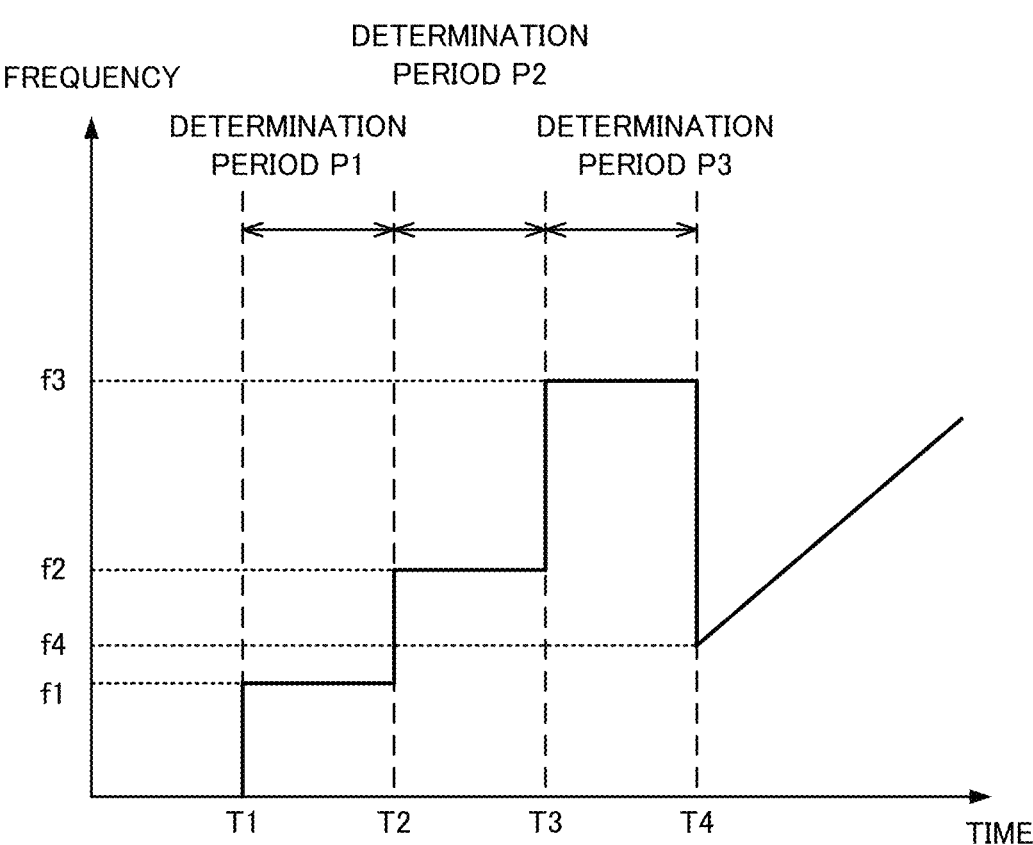
FIG. 10 is a graph illustrating an example frequency of a voltage command in Embodiment 2.

The control device 12 changes the frequency of the current component superimposed on the rated current for each determination period. More specifically, the coordinate converter 26 in the control device 12 outputs a voltage command having a different frequency for each determination period. FIG. 10 illustrates an example of the change in the frequency of the voltage command over time. Time T1 denotes the time at which the operation command S1 including the powering command is provided. At time T1, the control device 12 starts controlling the switching elements 13. In a determination period P1 immediately after time T1, the coordinate converter 26 generates, for example, a voltage command having a frequency matching a natural frequency f1 of the stator of the electric motor 91.

Time T2 denotes the end time of the determination period P1. In a determination period P2 immediately after time T2, the coordinate converter 26 generates, for example, a voltage command having a frequency matching a natural frequency f2 of the frame of the electric motor 91.

Time T3 denotes the end time of the determination period P2. In a determination period P3 immediately after time T3, the coordinate converter 26 generates, for example, a voltage command having a frequency matching a natural frequency f3 of the stator coils of the electric motor 91.

Time T4 denotes the end time of the determination period P3. At time T4, the rotational speed of the electric motor 91 substantially reaches the threshold rotational speed. At and after time T4, the coordinate converter 26 generates a voltage command having a frequency determined by the rotational speed of the electric motor 91.

The deterioration determining device 16 prestores information about the threshold spectrum corresponding to each of the multiple members of the electric motor 91 and the vibratory members. The deterioration determining device 16 compares the frequency spectrum value indicated by the frequency domain data with the threshold spectrum at the natural frequency of each of the multiple members of the electric motor 91 and the vibratory members, and determines any deterioration of each of the multiple members of the electric motor 91 and the vibratory members.

As described above, the drive apparatus 1 according to Embodiment 2 can determine any deterioration of each of the multiple members of the electric motor 91 and the vibratory members by changing the frequency of the current component included in the output current of the power circuit 11 for each determination period.

Embodiment 3

The deterioration determining device 16 may determine any deterioration of the members of the electric motor or the vibratory members based on measurement values of vibration sensors mounted on different vehicles 51 in the railway vehicle 100. In Embodiment 3 described below, a drive apparatus 2 also determines any deterioration of the members of an electric motor 95 in a vehicle 51 different from the vehicle 51 in which the electric motor 91 is installed and vibratory members that vibrate when receiving vibration resulting from the electromagnetic excitation force generated in the electric motor 95.

Figure 11:
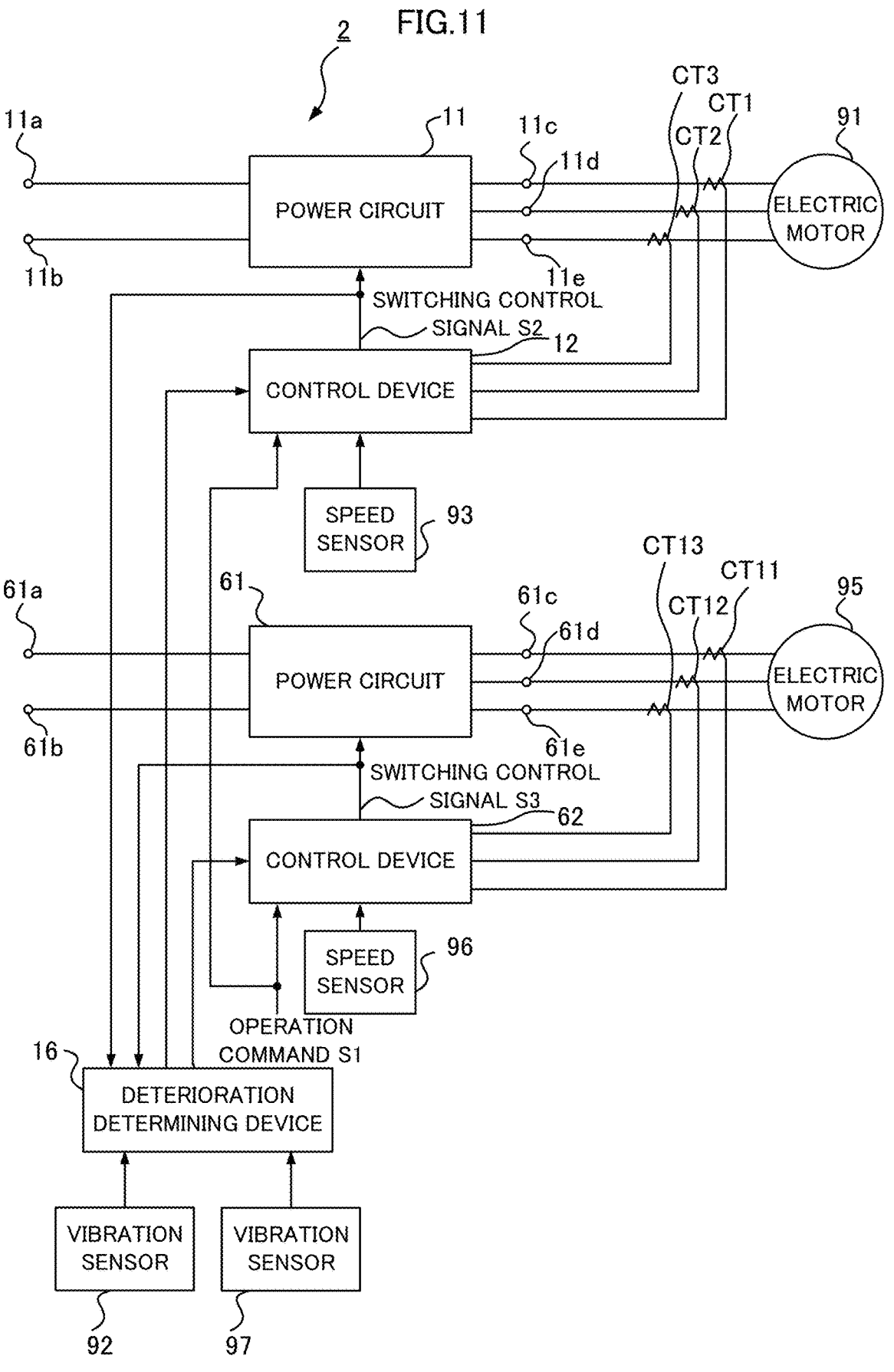
FIG. 11 is a block diagram of a drive apparatus according to Embodiment 3.

As illustrated in FIG. 11, the drive apparatus 2 according to Embodiment 3 includes, in addition to the components of the drive apparatus 1, a power circuit 61 that converts supplied DC power to three-phase AC power and supplies the resulting AC power to a load, and a control device 62 that generates multiple switching control signals S3 that control multiple switching elements 13 included in the power circuit 61 in response to the operation command S1.

The power circuit 61 is connected to the current collector 52 through, for example, a contactor or a reactor, which is not illustrated. The power circuit 61 has a structure similar to the structure of the power circuit 11. The power circuit 61 converts DC power supplied through input terminals 61a and 61b to three-phase AC power and supplies the resulting AC power to the electric motor 95 through output terminals 61c, 61d, and 61e. The electric motor 95 has a structure similar to the structure of the electric motor 91. Similarly to the electric motors 91, two electric motors 95 are attached to each of the two bogies 41 installed in a single vehicle 51.

Current sensors CT11, CT12, and CT13 have the same structures as the current sensors CT1, CT2, and CT3. The current sensors CT11, CT12, and CT13 measure the respective values of U-, V-, and W-phase currents output by the power circuit 61.

The control device 62 has a structure similar to the structure of the control device 12. The control device 62 acquires an operation command S1 from the driver's cab and acquires a measured rotational speed of the electric motor 95 from a speed sensor 96 that measures the rotational speed of the electric motor 95. The speed sensor 96 has a structure similar to the structure of the speed sensor 93. The control device 62 transmits the multiple switching control signals S3 to the multiple switching elements 13 included in the power circuit 61.

The deterioration determining device 16 determines any deterioration of the members of the electric motor 91, the vibratory members that vibrate when receiving vibration resulting from the electromagnetic excitation force generated in the electric motor 91, the members of the electric motor 95 installed in a vehicle 51 different from the vehicle 51 in which the electric motor 91 is installed, or the vibratory members that vibrate when receiving vibration resulting from the electromagnetic excitation force generated in the electric motor 95.

More specifically, the deterioration determining device 16 determines, while the power circuits 11 and 61 are each outputting a current including a current component having a frequency determined by the natural frequency of the members of the electric motors 91 and 95 or the vibratory members, any deterioration of the members of the electric motors 91 and 95 or the vibratory members based on the sensor signals acquired from the vibration sensors 92 and 97 that measure the vibration magnitude of the members of the electric motors 91 and 95 or the vibratory members.

The deterioration determining device 16 further determines, while the power circuits 11 and 61 are each outputting a current including a current component having a frequency determined by the value of a natural number multiple of the rotation frequency of the rotators that are ones of the members of the electric motors 91 and 95, any deterioration of the members of the electric motors 91 and 95 or the vibratory members based on the sensor signals acquired from the vibration sensors 92 and 97 that measure the vibration magnitude of the members of the electric motors 91 and 95 or the vibratory members.

The vibration sensor 97 has a structure similar to the structure of the vibration sensor 92. Similarly to the vibration sensors 92, each vibration sensor 97 is separate from but adjacent to the shaft of the corresponding electric motor 95.

The deterioration determining device 16 has a similar structure as in Embodiment 1. The AD converter 31 samples the sensor signals output by the vibration sensors 92 and 97 at predetermined sampling intervals, and generates digital data indicating the vibration magnitude measured by each of the vibration sensors 92 and 97.

The frequency converter 32 generates frequency domain data based on the measurement values of each vibration sensor 92 and frequency domain data based on the measurement values of each vibration sensor 97.

The determiner 33 determines any deterioration of the members of the electric motors 91 and 95 or the vibratory members using the variation in the frequency spectrum values indicated by the frequency domain data based on the measurement values of each vibration sensor 92 and the frequency spectrum values indicated by the frequency domain data based on the measurement values of each vibration sensor 97.

For example, the determiner 33 calculates the variance of the value of the frequency spectrum at the natural frequency of the shaft of the electric motor 91 indicated by the frequency domain data based on the measurement values of each vibration sensor 92 and of the value of the frequency spectrum at the natural frequency of the shaft of the electric motor 95 indicated by the frequency domain data based on the measurement values of each vibration sensor 97. When the calculated variance is greater than a variance threshold defined by the allowable range of the variation in the frequency spectrum values, the shaft of the electric motor 91 or 95 corresponding to the frequency spectrum value with the greatest deviation from the average of the frequency spectrum values can be determined as having deterioration.

As described above, the drive apparatus 2 according to Embodiment 3 can determine any deterioration of the members of the electric motors 91 and 95 or the vibratory members in different vehicles 51.

Embodiment 4

The method for the power circuit 11 to output a current component having a frequency determined by the natural frequency of the members of the electric motor 91 or the vibratory members or by the rotation frequency of the rotators is not limited to the above examples. In Embodiment 4 described below, a drive apparatus 1 includes a power circuit 11 that outputs, during coasting or braking of the railway vehicle 100, a current component having a frequency determined by the value of the natural frequency of the members of the electric motor 91 or the vibratory members or by the value of a natural number multiple of the rotation frequency of the rotators.

Figure 12:
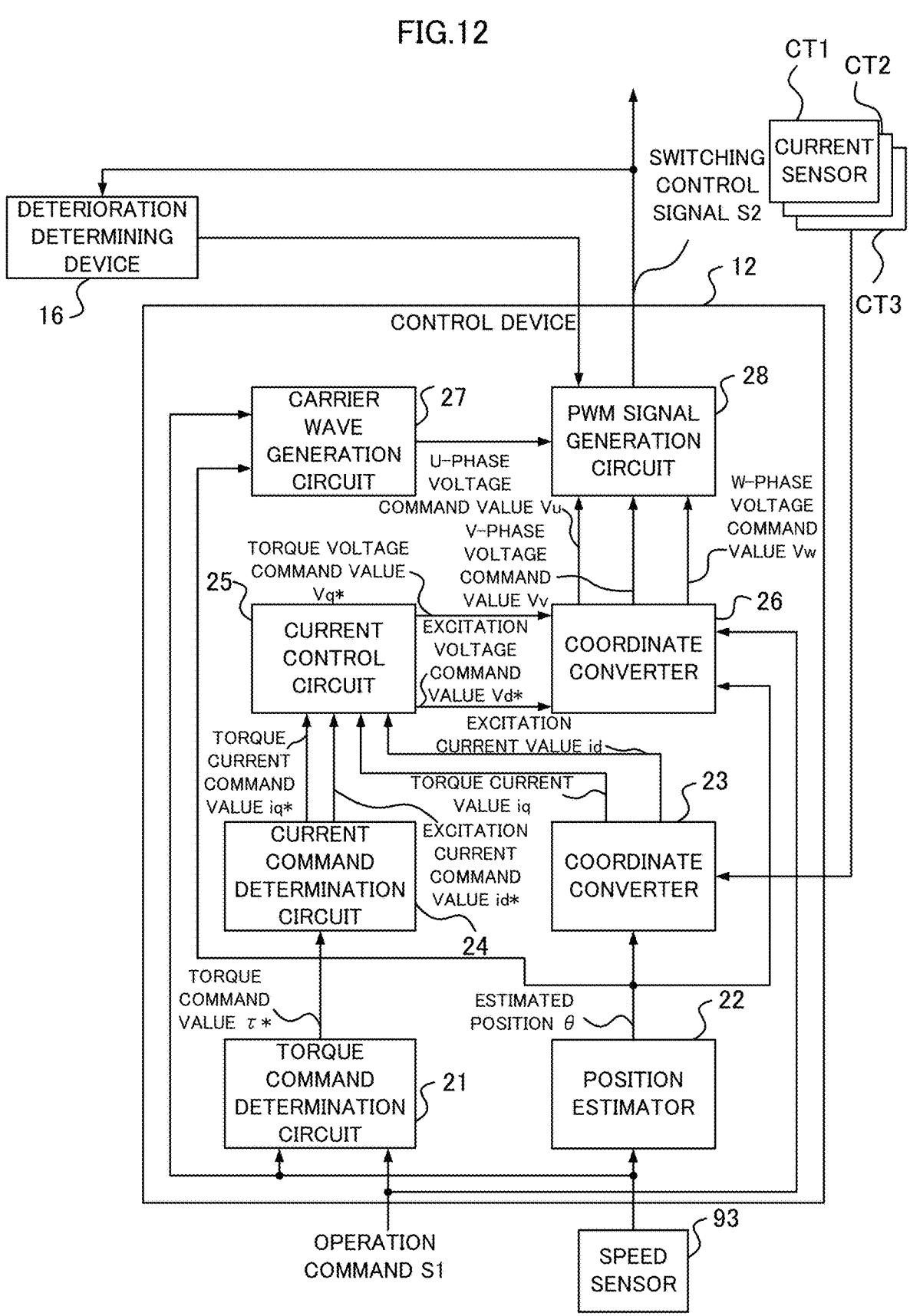
FIG. 12 is a block diagram of a control device in Embodiment 4.

The components of the drive apparatus 1 according to Embodiment 4 are the same as in Embodiment 1. The structure of the control device 12 illustrated in FIG. 12 is basically the same as in Embodiment 1, but differs from the structure in Embodiment 1 in that the coordinate converter 26 acquires the operation command S1.

Figure 13:
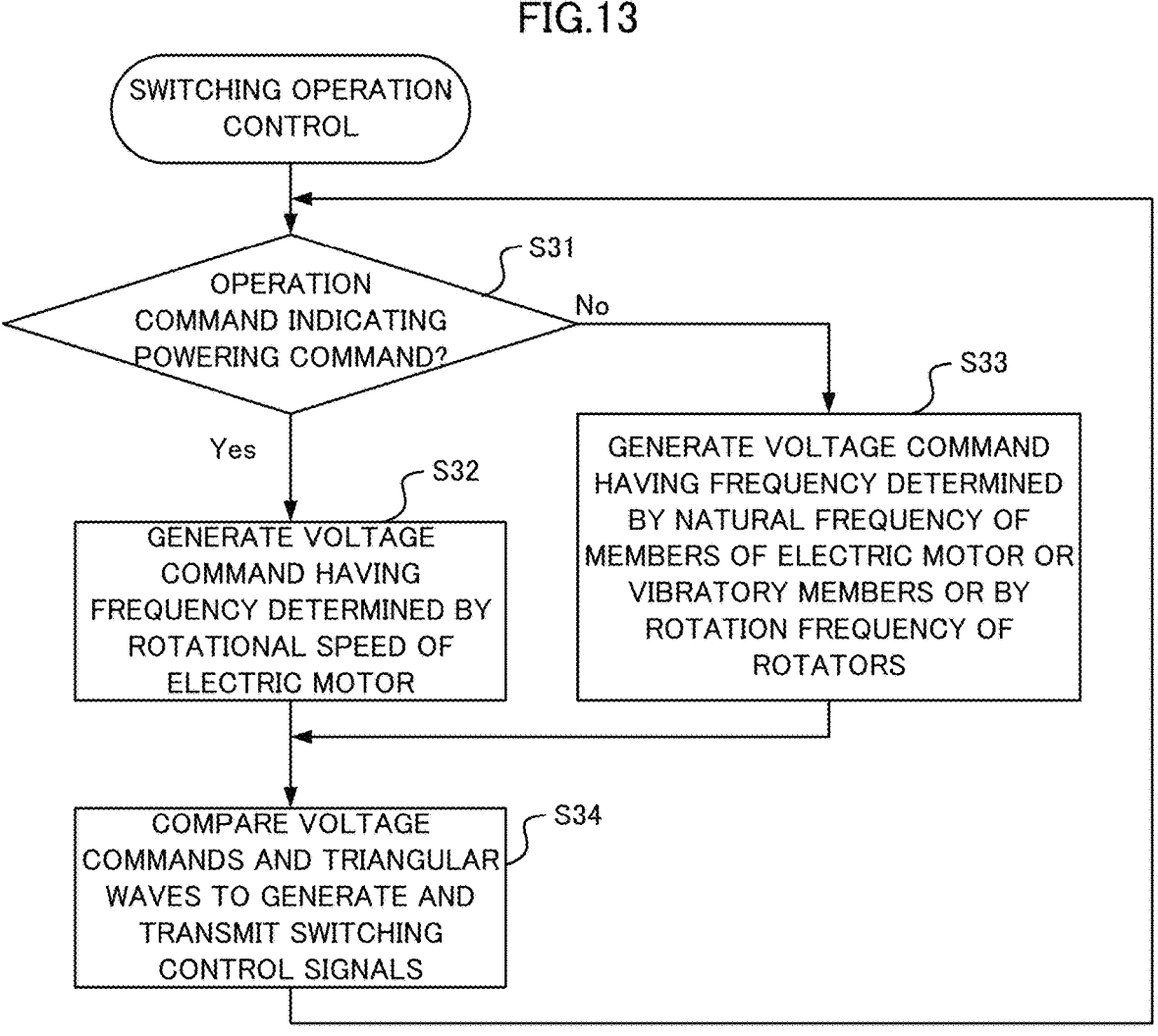
FIG. 13 is a flowchart of an example of process of switching operation control performed by the control device in Embodiment 4.

The operation of the control device 12 is described with reference to FIG. 13. When the control device 12 acquires the operation command S1 from the driver's cab, the control device 12 starts the operation illustrated in FIG. 13. When the operation command indicates a powering command (Yes in step S31), or in other words, during acceleration of the railway vehicle 100, the control device 12 generates a voltage command having a frequency determined by the rotational speed of the electric motor 91, more specifically, U-, V-, and W-phase voltage commands (step S32).

When the operation command indicates a coasting or braking command (No in step S31), or in other words, during coasting or deceleration of the railway vehicle 100, the control device 12 generates a voltage command having a frequency determined by the natural frequency of the members of the electric motor 91 or the vibratory member or by the rotation frequency of the rotator (step S33). More specifically, when the operation command S1 includes a coasting command or a braking command, the coordinate converter 26 generates a voltage command having a frequency determined by the natural frequency of the members of the electric motor 91 or the vibratory members, independently of the torque voltage command value Vq* and the excitation voltage command value Vd*. The voltage command generated in step S33, more specifically, the U-, V-, and W-phase voltage commands each have an amplitude smaller than an amplitude of the voltage command generated when the operation command S1 includes the powering command.

After the processing in steps S32 and S33, the PWM signal generation circuit 28 compares the U-phase voltage command value Vu, the V-phase voltage command value Vv, and the W-phase voltage command value Vw indicated by the U-, V-, and W-phase voltage commands with the values indicated by the carrier wave signals to generate the multiple switching control signals S2 and transmitting the switching control signals S2 to the multiple switching elements 13 (step S34). The above processing is then performed repeatedly from step S31.

As described above, the control device 12 controls the output voltage of the power circuit 11 to be closer to the target value indicated by the voltage command generated in step S32 or step S33. Thus, the frequency of the output voltage and the output current of the power circuit 11 substantially matches the frequency of the voltage command generated in step S32 or step S33. In other words, during coasting or braking of the railway vehicle 100, the frequency of the output current of the power circuit 11 is determined by the natural frequency of the members of the electric motor 91 or the vibratory members or by the rotation frequency of the rotators.

The structure and operation of the deterioration determining device 16 is basically the same as in Embodiment 1, but differs from the structure in Embodiment 1 in that the deterioration determining device 16 acquires the operation command S1. The deterioration determining device 16 starts the process illustrated in FIG. 8 when the operation command S1 includes a coasting command or a braking command.

As described above, during coasting or braking of the railway vehicle 100, the drive apparatus 1 according to Embodiment 4 outputs, from the power circuit 11, a current including a current component having a frequency determined by the natural frequency of the members of the electric motor 91 or the vibratory members. The drive apparatus 1 can determine, with the deterioration determining device 16, any deterioration of the members of the electric motor 91 or the vibratory members using the frequency spectrum indicated by the frequency domain data based on the measurement value of the vibration sensor 92.

During coasting or braking of the railway vehicle 100, the power circuit 11 outputs a current including a current component having a frequency determined by the natural frequency of the members of the electric motor 91 or the vibratory members. The drive apparatus 1 can thus determine any deterioration of the members of the electric motor 91 or the vibratory members without affecting the operation of the electric motor 91 during powering that generates a driving force for the railway vehicle 100.

The present disclosure is not limited to the above embodiments. The embodiments described above may be combined as appropriate. In one example, similarly to the drive apparatus 1 according to Embodiment 2, the drive apparatus 1 according to Embodiment 4 may change the frequency of the current output from the power circuit 11 for each determination period.

The output current of the power circuit 11 is not limited to a current component having a frequency matching the natural frequency of the components of the electric motor 91, but may include a current component having a frequency matching the natural frequency of the components of the electric motor 91, the natural frequency of the vibratory members, or the natural number multiple of the rotation frequency of the rotators that are ones of the members of the electric motor 91. In one example, the output current of the power circuit 11 may include a current component having a frequency matching a natural number multiple of the rotation frequency of the rotators of the electric motor 91, for example, a frequency matching a value twice the rotation frequency of the rotators of the electric motor 91.

The drive apparatus 1 may further include a power circuit that is independent of the power circuit 11 and that outputs a current having a frequency determined by the natural frequency of the members of the electric motor 91 or the vibratory members. The drive apparatus 1 may superimpose the current output by the power circuit on the output of the power circuit 11 to supply the superimposed current to the electric motor 91. In this case, preferably, the power circuit that is independent of the power circuit 11 outputs a current with an amplitude sufficiently smaller than the amplitude of the rated current of the power circuit 11.

Similarly, the drive apparatus 2 may further include a power circuit that is independent of the power circuits 11 and 61 and that outputs a current having a frequency determined by the natural frequency of the members of the electric motors 91 and 95 or the vibrated members. The drive apparatus 2 may superimpose the current output by the power circuit on the output of the power circuits 11 and 61 and supply the resulting output to the electric motor 95. In this case, preferably, the power circuit that is independent of the power circuits 11 and 61 outputs a current with an amplitude sufficiently smaller than the amplitude of the rated current of the power circuits 11 and 61.

The drive apparatus 1 may further include multiple power circuits that are independent of the power circuit 11 and that output a current having a frequency determined by the natural frequency of the components of the corresponding electric motor 91 or vibratory members or by the value of a natural number multiple of the rotation frequency of the rotators. The drive apparatus 1 may superimpose the current output by each power circuit on the output of the power circuit 11 and supply the resulting output to the electric motor 91. In this case, preferably, each power circuit that is independent of the power circuit 11 outputs a current with an amplitude sufficiently smaller than the amplitude of the rated current of the power circuit 11. When a current including multiple current components is supplied to the electric motor 91, several of the members of the electric motor 91 and the vibratory members resonate simultaneously. In this case, the deterioration determining device 16 can determine any deterioration of the members of the electric motor 91 and the vibratory members from the values of the frequency spectrum at the respective natural frequencies of the members of the electric motor 91 and the vibratory members indicated by the frequency domain data and the threshold spectrum at the respective natural frequencies of the members of the electric motor 91 and the vibratory members.

The structure of the control devices 12 and 62 is not limited to the above examples and can be any structure allowing generation of the switching control signals S2 that are PWM signals to control the switching elements 13 included in the power circuits 11 and 61. In one example, the carrier wave generation circuit 27 may generate a carrier wave signal that is a sawtooth wave.

The deterioration determining device 16 may be implemented as a function of the control device 12 or as a function of a non-illustrated train information management system.

The frequency converter 32 is not limited to the above example, but may perform, for example, the discrete Fourier transform (DFT) to generate frequency domain data.

In addition to determining any deterioration described above, the deterioration determining device 16 may also determine any sign of deterioration. For example, the determiner 33 included in the deterioration determining device 16 stores a first threshold spectrum and a second threshold spectrum greater than the first threshold spectrum. In this case, when, for example, the frequency spectrum at the natural frequency of the shaft of the electric motor 91 indicated by the frequency domain data is greater than or equal to the first threshold spectrum and less than the second threshold spectrum, the determiner 33 determines a sign of deterioration of the shaft of the electric motor 91. When, for example, the frequency spectrum at the natural frequency of the shaft of the electric motor 91 indicated by the frequency domain data is greater than or equal to the second threshold spectrum, the determiner 33 determines deterioration of the shaft of the electric motor 91.

The deterioration determining device 16 may transmit the determination result to a display in the driver's cab. In this case, the determination result is displayed on the display of the driver's cab, allowing the operator to be notified of any deterioration or a sign of deterioration of the members of the electric motors 91 and 95 or the vibratory members.

In the above embodiments, the determiner 33 prestores the value of the threshold spectrum, but may learn the value of the threshold spectrum through machine learning. For example, the determiner 33 learns, as a normal value, the value of the frequency spectrum indicated by the frequency domain data generated by the frequency converter 32 when the electric motor 91 is driven with neither the members of the electric motor 91 nor the vibratory members having deterioration. The determiner 33 learns, as an abnormal value, the value of the frequency spectrum indicated by the frequency domain data generated by the frequency converter 32 when the electric motor 91 is driven with either the members of the electric motor 91 or the vibratory members having deterioration. The determiner 33 may then determine a threshold spectrum having a value greater than the normal value and smaller than the abnormal value.

A contactor may be provided between each electric motor 91 and the power circuit 11 to disconnect the electric motor 91 from the power circuit 11. A contactor controller may also be provided to turn on/off the contactor. In this case, when the deterioration determining device 16 determines deterioration occurs in the members of an electric motor 91, the contactor controller turns off the contactor between the electric motor 91 with a deteriorating member and the power circuit 11. This allows the power circuit 11 to continue supplying power to the electric motors 91 with no deteriorating members.

The position at which each speed sensor 93 is attached is not limited to the above examples. The speed sensor 93 may be attached to the gear device 44 or the axle 45.

Figure 14:
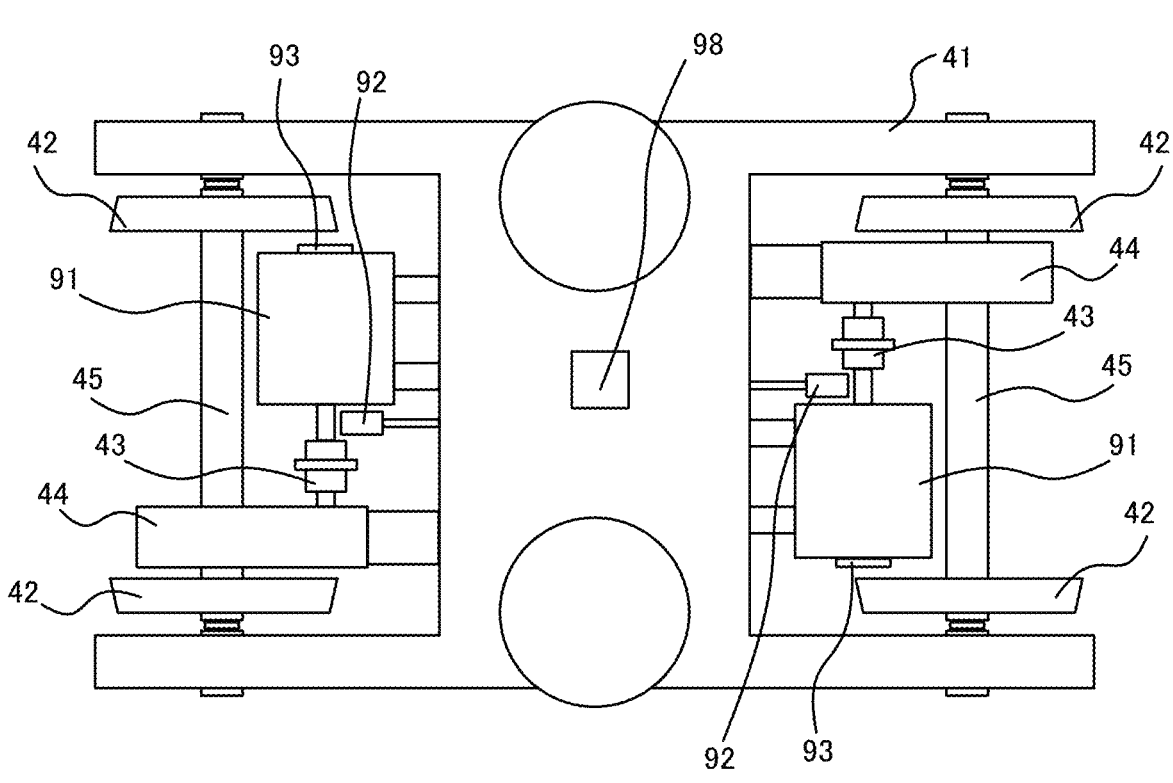
FIG. 14 is a diagram of vibration sensors attached at other example positions in the embodiments.
Figure 14:
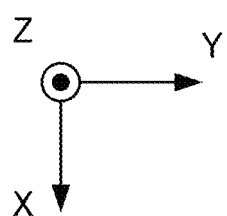

In addition to the vibration sensors 92, as illustrated in FIG. 14, a vibration sensor 98 may be attached to the bogie 41. In addition to the vibration sensors 94 illustrated in FIG. 9, the vibration sensor 98 illustrated in FIG. 14 may be provided.

Two of the current sensors CT1, CT2, and CT3 alone may be provided. For example, when the current sensors CT1 and CT2 alone are provided, the control device 12 estimates the value of the W-phase current based on the measurement value of the U-phase current acquired from the current sensor CT1 and the measurement value of the V-phase current acquired from the current sensor CT2.

The electric motors 91 and 95 are not limited to three-phase induction motors. In one example, the electric motors 91 and 95 may be synchronous electric motors or DC electric motors. When the electric motors 91 and 95 are DC electric motors, the power circuits 11 and 61 may output a current acquired by superimposing a current having a frequency determined by the natural frequency of the members of the electric motors 91 and 95 or the vibratory members on the DC current. In another example, the electric motors 91 and 95 may be inner rotors or outer rotors.

The loads to be deterioration determination targets of the drive apparatuses 1 and 2 are not limited to the electric motors 91 and 95, but may be any loads that receive power from the power circuits 11 and 61. In one example, the drive apparatuses 1 and 2 may determine any deterioration of the members of, for example, lighting equipment and an air conditioner.

The hardware configuration and the flowcharts described above are examples, and may be changed or modified as appropriate.

Figure 15:
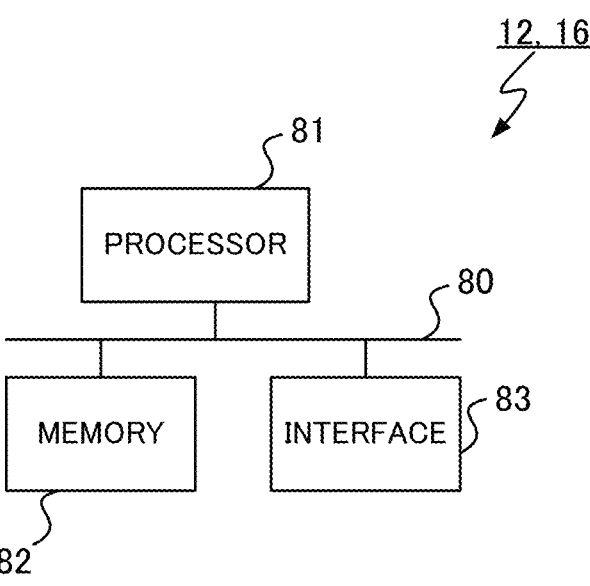
FIG. 15 is a block diagram of a control device and a deterioration determining device according to a modification of the embodiments, illustrating the hardware configuration.

The functions of the control device 12 and the deterioration determining device 16 may be implemented by software. In one example, FIG. 15 illustrates a hardware configuration of the control device 12 and the deterioration determining device 16 when the functions of the control device 12 and the deterioration determining device 16 are implemented by software. The control device 12 and the deterioration determining device 16 each include a processor 81, a memory 82, and an interface 83. A bus 80 connects the processor 81, the memory 82, and the interface 83 to one another.

The functions of the control device 12 and the deterioration determining device 16 are implemented by software, firmware, or a combination of software and firmware. The software and the firmware are described as programs and are stored in the memory 82. The processor 81 reads and executes the programs stored in the memory 82 to implement the functions of the above devices. In other words, the memory 82 stores programs for executing the processing of the control device 12 and the deterioration determining device 16.

The memory 82 is, for example, a nonvolatile or volatile semiconductor memory such as a random-access memory (RAM), a read-only memory (ROM), a flash memory, an erasable programmable read-only memory (EPROM), and an electrically erasable programmable ROM (EEPROM), a magnetic disk, a flexible disk, an optical disc, a compact disc, a minidisc, a digital versatile disc (DVD), and others.

Some of the functions of the control device 12 and the deterioration determining device 16 may be implemented by dedicated hardware, and other functions may be implemented by software or firmware. For example, in the control device 12, the torque command determination circuit 21, the current command determination circuit 24, the current control circuit 25, the carrier wave generation circuit 27, and the PWM signal generation circuit 28 may be implemented by the processing circuit 71 illustrated in FIG. 6, whereas the position estimator 22 and the coordinate converters 23 and 26 may be implemented by the processor 81 illustrated in FIG. 15 reading and executing the programs stored in the memory 82.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST 1, 2 Drive apparatus
11, 61 Power circuit
11a, 11b, 61a, 61b Input terminal
11c, 11d, 11e, 61c, 61d, 61e Output terminal
12, 62 Control device
13 Switching element
14 IGBT
15 Freewheeling diode
16 Deterioration determining device
21 Torque command determination circuit
22 Position estimator
23, 26 Coordinate converter
24 Current command determination circuit
25 Current control circuit
27 Carrier wave generation circuit
28 PWM signal generation circuit
31 AD converter
32 Frequency converter
33 Determiner
41 Bogie
42 Wheel
43 Coupling
44 Gear device
45 Axle
51 Vehicle
52 Current collector
71 Processing circuit

21

72 Interface circuit
80 Bus
81 Processor
82 Memory
83 Interface
91, 95 Electric motor
92, 94, 97, 98 Vibration sensor
93, 96 Speed sensor
100 Railway vehicle
101 Rail
102 Power line
C1 Capacitor
CT1, CT2, CT3, CT11, CT12, CT13 Current sensor
S1 Operation command
S2, S3 Switching control signal
The invention claimed is:

1. A drive apparatus, comprising:
a power circuit to output, to a load, a current including a current component having a frequency determined by a natural frequency of at least one member of the load, a natural frequency of a vibratory member to vibrate when receiving vibration resulting from an electromagnetic excitation force generated in the load, or a value of a natural number multiple of a rotation frequency of a rotator that is rotatable, the rotator being one of the at least one member; and
a deterioration determining device to generate frequency domain data indicating a magnitude of vibration of the load or the vibratory member for each frequency based on a sensor signal output by a vibration sensor to measure a magnitude of vibration of the load or the vibratory member, and determine any deterioration of the at least one member of the load or the vibratory member based on a value of a frequency spectrum indicated by the frequency domain data at the natural frequency or the rotation frequency used in determination of the frequency of the current component.

2. The drive apparatus according to claim 1, wherein
the power circuit outputs, to the load, a current including one or more current components each having a frequency determined by the natural frequency of one of the at least one member of the load or the vibratory member or by the value of the natural number multiple of the rotation frequency of the rotator, and having an amplitude smaller than an amplitude of a rated current of the power circuit.

3. The drive apparatus according to claim 2, wherein
the deterioration determining device determines any deterioration of the at least one member or the vibratory member based on the value of the frequency spectrum at the natural frequency indicated by the frequency domain data and a threshold spectrum defined for each of the at least one member and the vibratory member.

4. The drive apparatus according to claim 3, wherein
the at least one member of the load includes a plurality of members, and the power circuit outputs a current including a current component having a frequency determined by a value of the natural frequency of one of the plurality of members or the vibratory member or by the value of the natural number multiple of the rotation frequency of the rotator that is rotatable that is one of the plurality of members,
the power circuit changes the frequency of the current component for each determination period that is a period for determining deterioration, and
the deterioration determining device determines deterioration of the plurality of members and the vibratory member based on the value of the frequency spectrum indicated by the frequency domain data at the natural frequency or the rotation frequency used in determination of the frequency of the current component and the threshold spectrum defined for each of the plurality of members and the vibratory member.

5. The drive apparatus according to claim 2, wherein
the power circuit outputs, to an electric motor included in the load, a current including a current component having a frequency determined by a value of a natural number multiple of a rotation frequency of a rotor or a shaft that is the rotator included in the electric motor, the natural number being two or greater.

6. The drive apparatus according to claim 2, wherein
the drive apparatus is mountable on a railway vehicle, and includes a plurality of the power circuits each to output, to an electric motor included in a load of a plurality of the loads different from each other, a current including a current component having a frequency determined by a natural frequency of at least one member of the electric motor or the vibratory member corresponding to the electric motor to vibrate when receiving vibration resulting from an electromagnetic excitation force generated in the electric motor or by a value of a natural number multiple of a rotation frequency of a rotator that is rotatable, the rotator being one of the at least one member, and
the deterioration determining device generates the frequency domain data based on a sensor signal output by a vibration sensor to measure a magnitude of vibration of the electric motor receiving a current supply from a corresponding power circuit of the plurality of power circuits or a magnitude of vibration of the vibratory member corresponding to the electric motor, and determines any deterioration of the at least one member of the electric motor or the vibratory member based on a value of a frequency spectrum indicated by the frequency domain data for the electric motor or the vibratory member at the natural frequency or the rotation frequency used to determine the frequency of the current component.

7. The drive apparatus according to claim 1, wherein
the power circuit includes a plurality of switching elements, converts input power to alternating current power to be supplied to an electric motor included in the load to generate a driving force for a railway vehicle, and supplies the alternating current power resulting from conversion to the electric motor,
the drive apparatus further comprises a control device to generate a voltage command indicating a target value of an output voltage of the power circuit, generate a plurality of switching control signals determined by the voltage command and a carrier wave signal, and transmit the plurality of switching control signals to the plurality of switching elements included in the power circuit, and
the control device generates, during acceleration of the railway vehicle, the voltage command having a frequency determined by a rotational speed of the electric motor, and generates, during coasting or deceleration of the railway vehicle, the voltage command having a frequency determined by a value of a natural frequency of at least one member of the electric motor, a value of the natural frequency of the vibratory member, or the value of the natural number multiple of the rotation frequency of the rotator and having an amplitude smaller than an amplitude of the voltage command generated during acceleration of the railway vehicle.

8. The drive apparatus according to claim 7, wherein the deterioration determining device determines any deterioration of the at least one member or the vibratory member based on the value of the frequency spectrum at the natural frequency indicated by the frequency domain data and a threshold spectrum defined for each of the at least one member and the vibratory member.

9. The drive apparatus according to claim 8, wherein the at least one member of the load includes a plurality of members, and the power circuit outputs a current including a current component having a frequency determined by a value of the natural frequency of one of the plurality of members or the vibratory member or by the value of the natural number multiple of the rotation frequency of the rotator that is rotatable that is one of the plurality of members, the power circuit changes the frequency of the current component for each determination period that is a period for determining deterioration, and the deterioration determining device determines deterioration of the plurality of members and the vibratory member based on the value of the frequency spectrum indicated by the frequency domain data at the natural frequency or the rotation frequency used in determination of the frequency of the current component and the threshold spectrum defined for each of the plurality of members and the vibratory member.

10. The drive apparatus according to claim 7, wherein the control device stops supplying alternating current power to the electric motor when the deterioration determining device determines deterioration occurs in the at least one member or the vibratory member.

11. The drive apparatus according to claim 7, wherein the power circuit outputs, to an electric motor included in the load, a current including a current component having a frequency determined by a value of a natural number multiple of a rotation frequency of a rotor or a shaft that is the rotator included in the electric motor, the natural number being two or greater.

12. The drive apparatus according to claim 7, wherein the drive apparatus is mountable on a railway vehicle, and includes a plurality of the power circuits each to output, to an electric motor included in a load of a plurality of the loads different from each other, a current including a current component having a frequency determined by a natural frequency of at least one member of the electric motor or the vibratory member corresponding to the electric motor to vibrate when receiving vibration resulting from an electromagnetic excitation force generated in the electric motor or by a value of a natural number multiple of a rotation frequency of a rotator that is rotatable, the rotator being one of the at least one member, and the deterioration determining device generates the frequency domain data based on a sensor signal output by a vibration sensor to measure a magnitude of vibration of the electric motor receiving a current supply from a corresponding power circuit of the plurality of power circuits or a magnitude of vibration of the vibratory member corresponding to the electric motor, and determines any deterioration of the at least one member of the electric motor or the vibratory member based on a value of a frequency spectrum indicated by the frequency domain data for the electric motor or the vibratory member at the natural frequency or the rotation frequency used to determine the frequency of the current component.

13. The drive apparatus according to claim 1, wherein the power circuit superimposes, on a rated current, one or more current components each having a frequency determined by a value of the natural frequency of one of the at least one member of the load or the vibratory member or by the value of the natural number multiple of the rotation frequency of the rotator and having an amplitude smaller than an amplitude of the rated current, and outputs the rated current on which the one or more current components are superimposed.

14. The drive apparatus according to claim 1, wherein the power circuit converts input power to alternating current power to be supplied to an electric motor included in the load, and supplies the alternating current power resulting from conversion to the electric motor, the drive apparatus further comprises a control device to generate a voltage command indicating a target value of an output voltage of the power circuit, generate a plurality of switching control signals determined by the target value indicated by the voltage command and a value of a carrier wave signal, and transmit the plurality of switching control signals to a plurality of switching elements included in the power circuit, and the control device generates, when a rotational speed of the electric motor is higher than a threshold rotational speed, the voltage command having a frequency determined by the rotational speed of the electric motor, and generates, when the rotational speed of the electric motor is lower than or equal to the threshold rotational speed, the voltage command having a frequency determined by a value of a natural frequency of at least one member of the electric motor, a value of the natural frequency of the vibratory member, or the value of the natural number multiple of the rotation frequency of the rotator and having an amplitude smaller than an amplitude of the voltage command generated when the rotational speed of the electric motor is higher than the threshold rotational speed, the natural number being two or greater.

15. The drive apparatus according to claim 14, wherein the control device stops supplying alternating current power to the electric motor when the deterioration determining device determines deterioration occurs in the at least one member or the vibratory member.

16. The drive apparatus according to claim 1, wherein the deterioration determining device determines any deterioration of the at least one member or the vibratory member based on the value of the frequency spectrum at the natural frequency indicated by the frequency domain data and a threshold spectrum defined for each of the at least one member and the vibratory member.

17. The drive apparatus according to claim 16, wherein the at least one member of the load includes a plurality of members, and the power circuit outputs a current including a current component having a frequency determined by a value of the natural frequency of one of the plurality of members or the vibratory member or by the value of the natural number multiple of the rotation frequency of the rotator that is rotatable that is one of the plurality of members, the power circuit changes the frequency of the current component for each determination period that is a period for determining deterioration, and the deterioration determining device determines deterioration of the plurality of members and the vibratory member based on the value of the frequency spectrum indicated by the frequency domain data at the natural frequency or the rotation frequency used in determination of the frequency of the current component and the threshold spectrum defined for each of the plurality of members and the vibratory member.

18. The drive apparatus according to claim 1, wherein the power circuit outputs, to an electric motor included in the load, a current including a current component having a frequency determined by a value of a natural number multiple of a rotation frequency of a rotor or a shaft that is the rotator included in the electric motor, the natural number being two or greater.

19. The drive apparatus according to claim 1, wherein the drive apparatus is mountable on a railway vehicle, and includes a plurality of the power circuits each to output, to an electric motor included in a load of a plurality of the loads different from each other, a current including a current component having a frequency determined by a natural frequency of at least one member of the electric motor or the vibratory member corresponding to the electric motor to vibrate when receiving vibration resulting from an electromagnetic excitation force generated in the electric motor or by a value of a natural number multiple of a rotation frequency of a rotator that is rotatable, the rotator being one of the at least one member, and the deterioration determining device generates the frequency domain data based on a sensor signal output by a vibration sensor to measure a magnitude of vibration of the electric motor receiving a current supply from a corresponding power circuit of the plurality of power circuits or a magnitude of vibration of the vibratory member corresponding to the electric motor, and determines any deterioration of the at least one member of the electric motor or the vibratory member based on a value of a frequency spectrum indicated by the frequency domain data for the electric motor or the vibratory member at the natural frequency or the rotation frequency used to determine the frequency of the current component.

20. A deterioration determining method, comprising:

generating frequency domain data based on a sensor signal output by a vibration sensor to measure a magnitude of vibration of a load receiving a current supply from a power circuit or a magnitude of vibration of a vibratory member, the power circuit being configured to output a current including a current component having a frequency determined by a natural frequency of at least one member of the load or the vibratory member to vibrate when receiving vibration resulting from an electromagnetic excitation force generated in the load or by a value of a natural number multiple of a rotation frequency of a rotator that is rotatable, the rotator being one of the at least one member; and determining any deterioration of the at least one member of the load or the vibratory member based on a value of a frequency spectrum indicated by the frequency domain data at the natural frequency or the rotation frequency used in determination of the frequency of the current component.

* * * * *